(12) United States Patent
Levin et al.

(10) Patent No.: US 12,360,147 B2
(45) Date of Patent: Jul. 15, 2025

(54) DEVICE THAT INCLUDES A MEMS TUNABLE FILTER AND A METHOD FOR OPERATING THE DEVICE

(71) Applicant: Unispectral Ltd., Ramat Gan (IL)

(72) Inventors: Peleg Levin, Rishon Le-Zion (IL); Eliahu Chaim Ashkenazi, Jerusalem (IL); Ariel Raz, Kfar Vradim (IL)

(73) Assignee: Unispectral Ltd., Ramat Gan (IL)

( * ) Notice: Subject to any disclaimer, the term of this patent is extended or adjusted under 35 U.S.C. 154(b) by 883 days.

(21) Appl. No.: 17/431,682

(22) PCT Filed: Feb. 17, 2020

(86) PCT No.: PCT/IL2020/050175
§ 371 (c)(1),
(2) Date: Aug. 17, 2021

(87) PCT Pub. No.: WO2020/170241
PCT Pub. Date: Aug. 27, 2020

(65) Prior Publication Data
US 2022/0155581 A1    May 19, 2022

Related U.S. Application Data

(60) Provisional application No. 62/806,960, filed on Feb. 18, 2019.

(51) Int. Cl.
*G01R 27/26*    (2006.01)
*G01B 7/00*    (2006.01)
(Continued)

(52) U.S. Cl.
CPC .......... *G01R 27/2605* (2013.01); *G01B 7/00* (2013.01); *G01B 7/08* (2013.01); *G01R 31/00* (2013.01);
(Continued)

(58) Field of Classification Search
USPC ........................................................ 324/679
See application file for complete search history.

(56) References Cited

U.S. PATENT DOCUMENTS

| 2007/0046950 A1* | 3/2007 | Brown | G09G 3/3466 356/519 |
| 2009/0201008 A1 | 8/2009 | Chou et al. | |

(Continued)

FOREIGN PATENT DOCUMENTS

| CN | 1649265 A | 8/2005 |
| CN | 103119405 A | 5/2013 |
| CN | 106416097 A | 2/2017 |

OTHER PUBLICATIONS

Levin, Peleg, et al. "A Wafer Level Packaged Fully Integrated Tunable Fabry-Pérot Filter With Extended Optical Range for Multispectral and Hyperspectral Imaging." Journal of Microelectromechanical Systems 29.3 (2020): 357-369.

*Primary Examiner* — Farhana A Hoque
(74) *Attorney, Agent, or Firm* — Whitestone Law, PLLC

(57) ABSTRACT

The present disclosure provides, among other aspects, a technique, employed in a system and method, for monitoring a state of a tunable optical filter, typically a MEMS tunable filter such as a Fabry-Perot filter. The technique utilizes application of an actuation voltage signal characterized by a first component configured for causing a movement of a movable optical member of the tunable filter and a second component configured for being responsive for each given state of the tunable filter, i.e each optical gap results in a different response of the second component. The response of the second component to the state of the tunable filter, i.e. its variation profile from the original applied second component of the voltage signal is being indicative of the state of the tunable filter.

25 Claims, 9 Drawing Sheets

(51) Int. Cl.
*G01B 7/06* (2006.01)
*G01R 31/00* (2006.01)
*G01R 31/28* (2006.01)
*G02B 26/00* (2006.01)

(52) U.S. Cl.
CPC ........ *G01R 31/2829* (2013.01); *G02B 26/001* (2013.01); *G02B 26/007* (2013.01)

(56) References Cited

U.S. PATENT DOCUMENTS

| | | |
|---|---|---|
| 2009/0201242 A1 | 8/2009 | Govil |
| 2010/0245832 A1 | 9/2010 | Saari |
| 2011/0245892 A1* | 10/2011 | Kast ................... A61N 1/3787 29/600 |
| 2014/0205281 A1 | 7/2014 | Sone et al. |
| 2014/0375996 A1 | 12/2014 | Urushidani |

* cited by examiner

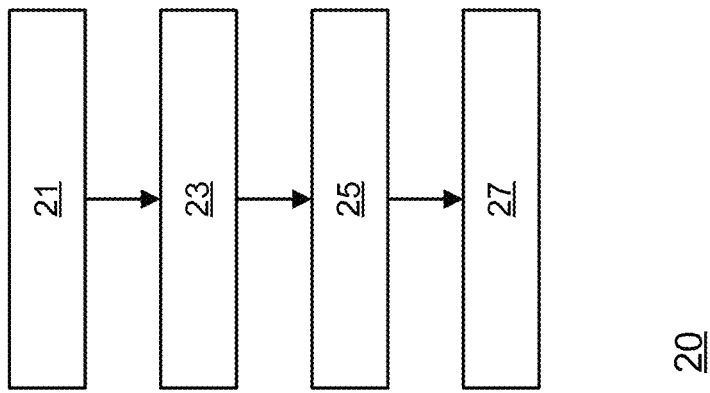
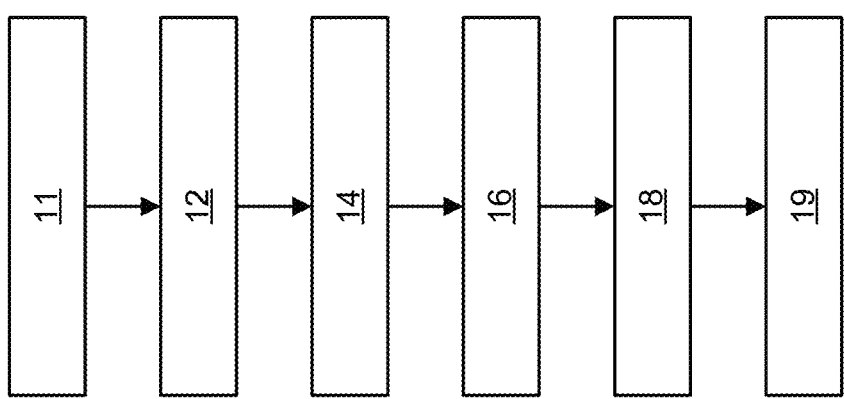

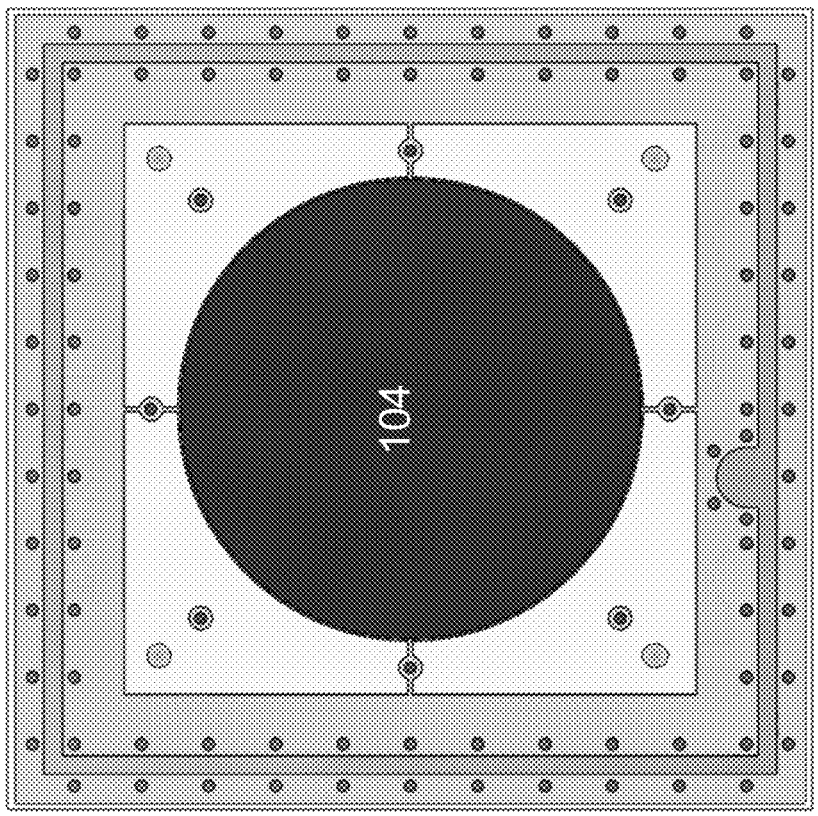
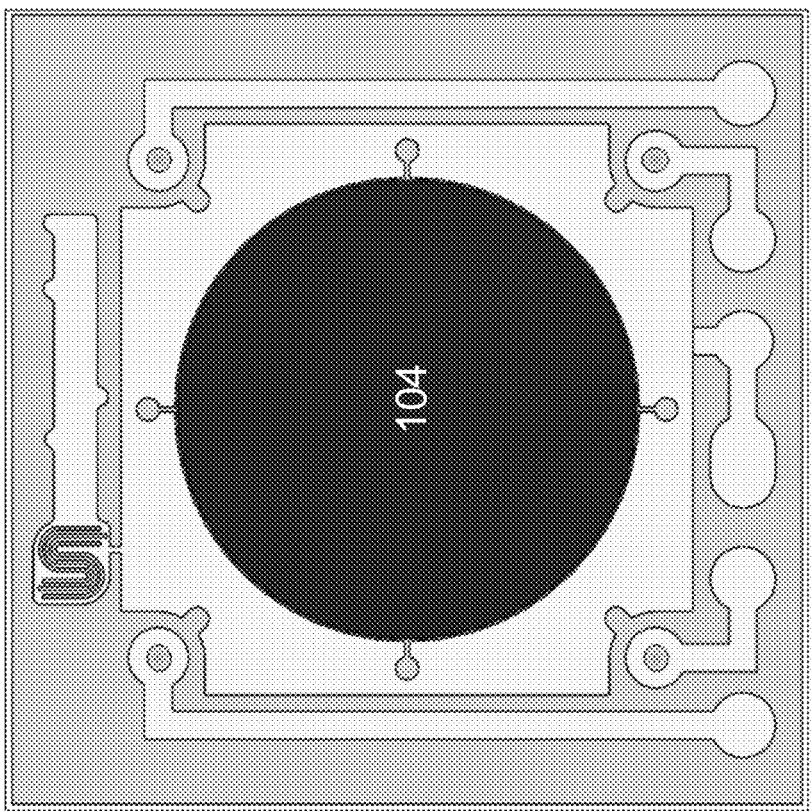
Fig. 12

DEVICE THAT INCLUDES A MEMS TUNABLE FILTER AND A METHOD FOR OPERATING THE DEVICE

BACKGROUND

A MEMS tunable filter may move between different states thereby changing its spectral response. Each state may be characterized by a width of a gap formed between optical elements of the MEMS tunable filter. Moving from one state to another and/or setting the MEMS tunable filter to a certain state involve a movement of one or more optical elements. This movement is induced by supplying one or more actuation signals to one or more electrodes related to the optical elements.

The movements may result in vibrations or oscillations of the gap that may temporarily prevent the acquisition of images—at least until the gap is stabilized.

These movements may be affected by an internal pressure maintained in the MEMS tunable filter.

Various parameters of the MEMS tunable filter may change over time. These parameters may include the internal pressure, the gap stabilization time, and the relationship between the one or more actuation signals and the gap.

There is a growing need to determine one or more parameters of the MEMS tunable filter in a reliable and cost effective manner. For example—without positioning dedicated sensors in the MEMS tunable filter.

GENERAL DESCRIPTION

There may be provided a method for operating a device that may include a microelectromechanical (MEMS) tunable filter and an image sensor, the method may include supplying, during a stabilization determination period, at least one actuation signal to the MEMS tunable filter for setting a gap between optical elements (interchangeable throughout the application with the term "optical members") of the MEMS tunable filter, wherein the gap determines a spectral response of the MEMS tunable filter; acquiring images, by the image sensor, at different points of time during the stabilization determination period, wherein the acquiring of the images starts before the gap stabilizes; and determining a stabilization period of the gap based on at least a subset of pixels of the images.

The determining of the stabilization period may include searching for regions of consecutive images that correspond to a same area in space that are substantially identical to each other.

The method may include determining when to start the acquiring of the images based on an estimated stabilization period of the gap.

The method may include determining a value of each one of the at least one actuation signal.

The method may include determining a value of each one of the at least one actuation signal; wherein the determining of the value is responsive to an ambient temperature.

The method may include measuring, during a capacitance determination period, a capacitance between electrodes related to the optical elements.

The method may include providing, during a capacitance determination period, at least one actuation signal to electrodes coupled to the optical elements; waiting for at least the stabilization period; and measuring, following the waiting and during the capacitance determination period, the capacitance between the electrodes related to the optical elements.

The method may include maintaining, by an enclosure of the MEMS tunable filter, a pressure difference between an ambient pressure level and a pressure level that exists in an internal space defined by the enclosure; wherein one or more of the optical elements is located within the internal space.

The method may include measuring, during a pressure level determination period, a capacitance between electrodes related to the optical elements; and determining the pressure level that exists in the internal space based on the capacitance between the electrodes related to the optical elements.

The method may include performing, during different points in time of a gap monitoring period, different measurements of a capacitance between electrodes related to the optical elements; and searching for capacitance measurement results that are indicative of vibrations of the optical elements.

The searching may include searching for a repetitive change in the capacitance measurement results.

The method may include damping vibrations of the optical elements.

The method may include damping vibrations of the gap by supplying actuation signals to electrodes related to the optical elements; wherein each actuation signal is supplied by a path that may include a resistor.

The method may include damping vibrations of the gap by supplying a first actuation signal to a first electrode related to a first optical element of the optical elements; wherein the first actuation signal is supplied by a path that may include a first resistor that is serially coupled to the first electrode.

The method may include damping vibrations of the gap by supplying a first actuation signal to a first electrode related to a first optical element of the optical elements; wherein the first actuation signal is supplied by a path that may include a first resistor that is parallelly coupled to the first electrode.

The method may include damping vibrations of the gap by supplying a first actuation signal to a first electrode related to a first optical element of the optical elements; wherein the first actuation signal is supplied by a path that may include a first variable resistor that is coupled to the first electrode.

The method may include maintaining, by an enclosure of the MEMS tunable filter, a pressure difference between an ambient pressure level and a pressure level that exists in an internal space defined by the enclosure; wherein one or more of the optical elements is located within the internal space; supplying, during a pressure level determination period, at least one actuation signal to the MEMS tunable filter for setting the gap; acquiring images, by the image sensor, at different points of time during the pressure level determination period, following the supplying of the at least one actuation signal; and determining a pressure level that exists in the internal space based on at least a subset of pixels of the images obtained during the pressure level determination period.

The determining may include searching for pixel values that are indicative of vibrations of the gap.

The searching is followed by determining a period of the vibrations and determining the pressure level based on the period of the vibrations.

The method may include maintaining, by an enclosure of the MEMS tunable filter, a pressure difference between an ambient pressure level and a pressure level that exists in an internal space defined by the enclosure; wherein one or more of the optical elements is located within the internal space; and repeating, for each sub-period of a pressure level determination period, the steps of: supplying, at a beginning of the each sub-period, at least one actuation signal to the MEMS tunable filter for setting the gap; acquiring images, by the image sensor, at different points of time during the each sub-period, following the supplying, at the beginning of the each sub-period, of the at least one actuation signal; and wherein the method further may include determining a pressure level that exists in the internal space based on at least a subset of pixels of the images obtained during the pressure level determination period.

The acquiring of the images, at different points of time during the each sub-period, occurs at a rate that does not exceed 16,000 frames per second.

The acquiring of the images, at different points of time during the each sub-period, occurs at a rate that does not exceed 8,000 frames per second.

The determining may include searching for pixel values that are indicative of vibrations of the gap.

The searching is followed by determining a period of the vibrations and determining the pressure level based on the period of the vibrations.

The method may include individually supplying hybrid signals, during a gap evaluation period, to each electrode out of (a) a first group of electrodes that are related to a first optical element of the optical elements, and (b) a second group of electrodes that are related to a second optical element of the optical elements; wherein each hybrid signal includes a direct current (DC) component and an alternate current (AC) component.

The method may include performing, during different points in time of the gap evaluation period, different measurements of a capacitance of each of the electrodes; and evaluating one or more dimensional parameters of the gap based on the different measurements of the capacitance of each of the electrodes.

The performing of the different measurements of the capacitance of each of the electrodes may include (a) measuring signals received from each of the electrodes, and (b) estimating the capacitance of each of the electrodes based on the signals received from each of the electrodes.

The method may include measuring, for each electrode, a difference between (a) a peak to peak amplitude of a hybrid signal supplied to the electrode, and (b) a peak to peak amplitude of a signal received from the electrode; and determining the one or more dimensional parameters of the gap based in differences related to at least some of the first and second groups of electrodes.

The method may include calculating a difference signal, for each electrode by subtracting, the signal received from the electrode from the hybrid signal supplied to the electrode; and determining the one or more dimensional parameters of the gap based in difference signals related to at least some of the first and second groups of electrodes.

There may be provided a device that is configured to execute the mentioned above method.

There may be provided a non-transitory computer readable medium that stores instructions for executing the mentioned above method.

There may be provided a method for operating a device that may include a microelectromechanical (MEMS) tunable filter and an image sensor, the method may include supplying hybrid signals, during an evaluation period, to multiple electrodes that are coupled to multiple optical elements of the MEMS tunable filter that are spaced apart from each other by one or more gaps; wherein the one or more gaps determine a spectral response of the MEMS tunable filter; wherein each hybrid signal includes a direct current (DC) component and an alternate current (AC) component; and performing, during different points in time of the evaluation period, different measurements of signals received, responsive to the supplying of the hybrid signals, from the multiple electrodes; and evaluating one or more dimensional parameters of the one or more gaps based on the different measurements of the signals received from the multiple electrodes.

The method may include individually supplying the hybrid signals to each one of the multiple electrodes.

The DC component exceeds the AC component.

The each electrodes receives concurrently the DC component and the AC component.

The at least two hybrid signals supplied to at least two electrodes have a same AC component but have different DC components.

The method may include generating a reference signal that has an AC component and no DC component, wherein a relationship between the reference signal and the measured response of the capacitance in each electrode is indicative of the dimensional parameters.

There may be provided a device that is configured to execute said mentioned above method.

There may be provided a non-transitory computer readable medium that stores instructions for executing the mentioned above method.

There may be provided a method for operating a device that may include a microelectromechanical (MEMS) tunable filter and an image sensor, the method may include maintaining, by an enclosure of the MEMS tunable filter, a pressure difference between an ambient pressure level and a pressure level that exists in an internal space defined by the enclosure; wherein one or more optical elements out of multiple optical elements of the MEMS tunable filter are located within the internal space; wherein the multiple optical elements are spaced apart from each other by one or more gaps; wherein the one or more gaps determine a spectral response of the MEMS tunable filter; repeating, for each sub-period of a pressure level determination period, the steps of: supplying, at a beginning of the each sub-period, at least one actuation signal to the MEMS tunable filter for setting the gap; acquiring images, by the image sensor, at different points of time during the each sub-period, following the supplying, at the beginning of the each sub-period, of the at least one actuation signal; and wherein the method further may include determining a pressure level that exists in the internal space based on at least a subset of pixels of the images obtained during the pressure level determination period.

The determining may include searching for pixel values that are indicative of vibrations of the gap.

The searching is followed by determining a period of the vibrations and determining the pressure level based on the period of the vibrations.

There may be provided a device that is configured to execute said mentioned above method.

There may be provided a method for operating a device that may include a microelectromechanical (MEMS) tunable filter and an image sensor, the method may include maintaining, by an enclosure of the MEMS tunable filter, a pressure difference between an ambient pressure level and a pressure level that exists in an internal space defined by the enclosure; wherein one or more optical elements of multiple optical elements of the MEMS tunable filter are located within the internal space; wherein the multiple optical elements are spaced apart from each other by one or more gaps; supplying, during a pressure level determination period, at least one actuation signal to the MEMS tunable filter for setting the one or more gap; acquiring images, by the image sensor, at different points of time during the pressure level determination period, following the supplying of the at least one actuation signal; and determining a pressure level that exists in the internal space based on at least a subset of pixels of the images obtained during the pressure level determination period.

The determining may include searching for pixel values that are indicative of vibrations of the optical elements.

The one or more gaps may determine a spectral response of the MEMS tunable filter.

There may be provided a device that is configured to execute said mentioned above method.

There may be provided a method for operating a device that may include a microelectromechanical (MEMS) tunable filter and an image sensor, the method may include maintaining, by an enclosure of the MEMS tunable filter, a pressure difference between an ambient pressure level and a pressure level that exists in an internal space defined by the enclosure; wherein one or more of the optical elements of the MEMS tunable filter are located within the internal space; performing, during different points in time of a gap monitoring period, different measurements of a capacitance between electrodes related to the optical elements; and searching for capacitance measurement results that are indicative of vibrations of the one or more optical elements.

There may be provided a device that is configured to execute said mentioned above method.

There may be provided a non-transitory computer readable medium that stores instructions for executing the mentioned above method.

There may be provided a method for operating a device that may include a microelectromechanical (MEMS) tunable filter and an image sensor, the method may include maintaining, by an enclosure of the MEMS tunable filter, a pressure difference between an ambient pressure level and a pressure level that exists in an internal space defined by the enclosure; wherein optical elements of the MEMS tunable filter are located within the internal space; supplying, during a pressure level determination period, at least one actuation signal to the MEMS tunable filter for setting a gap between the optical elements; acquiring images, by the image sensor, at different points of time during the pressure level determination period, following the supplying of the at least one actuation signal; and determining a pressure level that exists in the internal space based on at least a subset of pixels of the images obtained during the pressure level determination period.

There may be provided a device that is configured to execute said mentioned above method.

There may be provided a non-transitory computer readable medium that stores instructions for executing the mentioned above method.

There may be provided a method for operating a device that may include a microelectromechanical (MEMS) tunable filter and an image sensor, the method may include maintaining, by an enclosure of the MEMS tunable filter, a pressure difference between an ambient pressure level and a pressure level that exists in an internal space defined by the enclosure; and repeating, for each sub-period of a pressure level determination period, the steps of: supplying, at a beginning of the each sub-period, at least one actuation signal to the MEMS tunable filter for setting a gap between optical elements of the MEMS tunable filter that are located within the internal space; acquiring images, by the image sensor, at different points of time during the each sub-period, following the supplying, at the beginning of the each sub-period, of the at least one actuation signal; and wherein the method further may include determining a pressure level that exists in the internal space based on at least a subset of pixels of the images obtained during the pressure level determination period.

There may be provided a device that is configured to execute said mentioned above method.

There may be provided a non-transitory computer readable medium that stores instructions for executing the mentioned above method.

There may be provided a method for operating a device that may include a microelectromechanical (MEMS) tunable filter and an image sensor, the method may include individually supplying hybrid signals, during a gap evaluation period, to each electrode of the MEMS tunable filter out of (a) a first group of electrodes that are related to a first optical element of the MEMS tunable filter, and (b) a second group of electrodes that are related to a second optical element of the MEMS tunable filter; wherein the first optical element and the second optical element are separated by an optical gap; and wherein each hybrid signal includes a direct current (DC) component and an alternate current (AC) component.

The method may include measuring, for each electrode, a difference between (a) a peak to peak amplitude of a hybrid signal supplied to the electrode, and (b) a peak to peak amplitude of a signal received from the electrode; and determining the one or more dimensional parameters of the gap based in differences related to at least some of the first and second groups of electrodes.

There may be provided a device that is configured to execute said mentioned above method.

There may be provided a non-transitory computer readable medium that stores instructions for executing the mentioned above method.

There may be provided a method for operating a device that may include a microelectromechanical (MEMS) tunable filter and an image sensor, the method may include supplying at least one actuation signal to the MEMS tunable filter for setting a gap between optical elements of the MEMS tunable filter, wherein the supplying may include damping vibrations of the gap by supplying actuation signals to electrodes related to the optical elements; wherein each actuation signal is supplied by a path that may include a resistor.

Any combination of any step of any of the method mentioned in any part of the application may be provided.

There may be provided a device that is configured to execute said mentioned above method.

There may be provided a device that includes a tunable filter that is capable of executing at least one of the methods illustrated in the specification.

There may be provided a non-transitory computer readable medium that stores instructions for executing at least one of the methods illustrated in the specification.

An aspect of the present disclosure provides a system for monitoring a state of a tunable optical filter, typically a MEMS tunable filter, e.g. a Fabry-Perot filter. The tunable filter includes a first and second optical members (interchangeable throughout the application with the term "optical elements") and at least the first member is movable with respect to the second member upon application of voltage difference between first actuation regions on the first member and respective second actuation regions on the second member. The system includes a processing circuitry configured to (i) operate a voltage source, or at times more than one voltage sources, for applying a selected and desired profile of a voltage signal to at least one of said first or second actuation regions, typically a desired voltage profile is provided independently to more than one actuation regions. The selected profile includes at least a first component for resulting a movement of the movable member, namely to trigger actuation thereof to obtain a desired optical gap between various regions of the two optical members, and a second component being responsive to a given state of the tunable filter, namely for each state of the tunable filter, e.g. each optical gap, the second component is resultant in a different response. In other words, the second component is designed for being varied in response for a given state of the tunable filter, namely for each given state of the tunable device, the signal is varied in a unique way. The variation of the signal occurs due to the varied capacitance between the first actuation region and the respective second actuation region. It is to be noted that the first component may also be responsive to a given state of the tunable filter, though typically the effect on it is significantly lower than the effect of the second component. A first voltage source may be operable and/or configured for applying the first component and a second voltage source may be operable and/or configured for applying the second component. The processing circuitry is further configured to (ii) analyze a resultant signal (namely a signal that is retrieved from each actuation region) of the voltage signal and determine a variation profile of the resultant signal from the provided voltage signal. The determined variation profile is being indicative of the state of the tunable filter.

In some embodiments of the system, the analysis includes determining the variation profile of the second component.

In some embodiments, the system includes a second component extractor, i.e. a sampling unit, configured to extract the second component from the resultant signal and transmit it to the processing circuitry for determining the variation profile thereof.

In some embodiments of the system, the voltage signal is a composite signal and the first and the second components are having different frequency characteristics. It is to be noted that one of the components can be a DC signal with a frequency of 0.

In some embodiments o the system, the first component is a DC component and the second component is an AC component.

In some embodiments of the system, the AC component is characterized by a frequency higher than the resonance frequency of the first movable member. In some embodiments, the frequency of the AC component is at least 2, 3, 4 or 5-folds larger than the resonance frequency of the first member, i.e. that the MEMS eigenfrequency.

In some embodiments of the system, the state of the tunable filter is a gap between the first actuation region and the respective second actuation region. In some embodiments, the gap between the first actuation region and the respective second actuation region is correlated to the optical gap of the tunable optical filter.

In some embodiments of the system, the state of the tunable filter is a state that is associated optical gap of one or more portions of the tunable filter.

In some embodiments of the system, the processing circuitry is configured to operate the voltage source(s) to provide a reference signal that has at least a component, e.g. an AC component, that is identical to the second component, e.g. a similar AC component, of the voltage signal and the analysis includes determining a relation between a varied second component of the resultant signal, e.g. the variation of the AC signal in result of the actuation process, with the reference signal and determining the variation profile based thereon. In particular, the analysis includes determining the subtraction of the second component from the reference signal, the subtraction product is being indicative to the state of the tunable filter. In some embodiments of the system, the sampled signal that is being analyzed is the subtraction product of the varied second component of the resultant signal and the reference signal. In some embodiments, the reference signal has two components, a first, DC component, having a value of the average of all the DC components provided to all actuation regions, and a second, AC component, that is similar to all the AC components provided to the actuation regions. In this embodiment, the analysis includes subtracting the reference signal, namely its first and second components, from the resultant signal retrieved from an actuation region and determine the variation profile of the subtraction product, which is indicative of the state of the tunable optical filter, e.g. its optical gap in one or more locations.

In some embodiments, the system includes a reference capacitance for receiving the reference signal, the processing circuitry is configured for retrieving an output of the reference signal from said reference capacitance subtracted from the resultant signal to determine the variation for obtaining the state of the tunable filter.

In some embodiments of the system, the second actuation regions includes or being electrodes.

In some embodiments of the system, the analysis includes determining a variation of the amplitude of the second component, for example by determining (a) a peak to peak amplitude of the AC component supplied to the electrode, and (b) a peak to peak amplitude of a signal retrieved from the actuation region. The analysis may also be performed by performing phase shift measurement technique.

In some embodiments of the system, the processing circuitry is further configured for controlling the selected profile of the voltage signal in response to the monitored state of the tunable filter. Namely, the processing circuitry is configured for identifying the gap between the optical members and updating the selected profile of the voltage signal to obtain a desired optical gap efficiently. This process constitutes a closed loop or semi-closed loop control system. For example, the first component may be updated based on the monitored state of the tunable filter according to a certain equation. As a non-limiting example the equation may be:

$$V=k(gap\_des-gap\_meas)$$

wherein V is the applied DC voltage, gap_des is the desired optical gap and gap_meas is the measured optical gap.

In some embodiments of the system, the processing circuitry is configured to operate the voltage source(s) for applying a unique selected profile of a voltage signal to each of the at least one of the first or second actuation regions. Namely, each actuation region is provided with a unique voltage profile independent to other profiles of different actuation regions.

In some embodiments of the system, each of the unique selected profiles includes an identical second component, i.e. the second component is common in each unique selected profile.

In some embodiments, the system includes a dissipation element, i.e. an element that is capable of dissipation of energy, e.g. via heat, that is electrically connected to at least one first or second actuation regions. It should be noted that in some embodiments the dissipation element may be connected in series to the first or second actuation regions at one side and to at least one of the voltage sources at its other side.

In some other embodiments, the dissipation element may be connected in parallel such that most of the electrical current passes therethrough. The dissipation element is configured such that upon oscillation of the first member energy is dissipated therethrough to obtain a quality factor of the first member lower than 1000, 500, 400, 300, 200, 100, 90, 80, 70, 60, 50, 40, 30, 20 or 10, or 1 thereby reducing stabilization time of the first member upon actuating the tunable filter to a desired gap.

In some embodiments of the system, the dissipation element is a resistor electrically connected in series from one side to at least one first or second actuation regions and from the other side to the voltage source. Namely, the resistor is disposed in an electrical circuit with the first and second actuation regions, connecting at least one of them to the voltage source that provides the first signal for actuation such that electric charges from the voltage source reach the actuation regions, and vice versa, pass through the resistor.

Another aspect of the present disclosure provides a method for monitoring and/or controlling a state of a tunable filter. The tunable filter includes a first and second optical members, at least the first member is movable with respect to the second member upon application of voltage difference between first actuation regions thereon and respective second actuation regions on the second member. The method includes applying a selected profile of a voltage signal to at least one of said first or second actuation regions. The selected profile includes at least a first component for resulting a movement of the movable member towards a desired actuation gap and a second component being responsive to a given state of the tunable filter, namely for each state of the tunable filter, e.g. each optical gap, the second component is resultant in a different response. In other words, the second component is designed for being varied in response for a given state of the tunable filter, namely for each given state of the tunable device, the signal is varied in a unique way. The method further includes retrieving and analyzing a resultant signal, namely a signal that is retrieved from each actuation region after being applied thereto, of the voltage signal and determining a variation profile of the resultant signal from the provided voltage signal. The variation profile is being indicative of the state of the tunable filter, namely the optical gap of the tunable filter is determined by the variation profile.

In some embodiments of the method, the analysis includes determining the variation profile of the second component.

In some embodiments, the method includes extracting the second component and analyzing it for determining a variation profile thereof that is being indicative of the state of the tunable filter.

In some embodiments of the method, the voltage signal is a composite signal and the first and the second components are having different frequency characteristics, wherein a DC component is considered as having a frequency of 0.

In some embodiments of the method, the first component is a DC component and the second component is an AC component.

In some embodiments of the method, the AC component is characterized by a frequency higher than the resonance frequency of the first member. In some embodiments, the frequency of the AC component is at least 2, 3, 4 or 5-folds larger than the resonance frequency of the first member, i.e. that the MEMS eigenfrequency.

In some embodiments, the method includes applying a reference signal that is identical to said second component of the voltage signal, wherein said analysis comprises determining a relation between a varied second component of the resultant signal, e.g. variation of the AC component, with the reference signal and determining the variation profile. In particular, the analysis comprises determining the subtraction of the second component from the reference signal, the subtraction product is being indicative to the state of the tunable filter. In some embodiments the sampled signal that is being analyzed is the subtraction product of the varied second component of the resultant signal and the reference signal.

In some embodiments, the reference signal has two components, a first, DC component, having a value of the average of all the DC components provided to all actuation regions, and a second, AC component, that is similar to all the AC components provided to the actuation regions. In this embodiment, the analysis includes subtracting the reference signal, namely its first and second components, from the resultant signal retrieved from an actuation region and determine the variation profile of the subtraction product, which is indicative of the state of the tunable optical filter, e.g. its optical gap in one or more locations.

In some embodiments of the method, said retrieving and analyzing are performed during the movement of the first member.

In some embodiments, the method includes controlling the selected profile of the voltage signal, in particular the first component, in response to the monitored state of the tunable filter to update the required voltage to bring the tunable filter to the desired state efficiently.

In some embodiments, the method includes applying a unique selected profile of a voltage signal to each of the at least one of said first or second actuation regions.

In some embodiments of the method, each of the unique selected profiles comprises an identical second component. Namely a common second component, e.g. a common AC signal, is provided in each unique profile.

Another aspect of the present disclosure provides a tunable filter. The tunable filter includes a first and second optical members, each includes first and second actuation regions respectively such that at least the first member is movable with respect to the second member upon application of voltage difference between the first actuation regions thereon and the respective second actuation regions on the second member. The tunable filter further includes a dissipation element, i.e. an element that is capable of dissipating energy, e.g. via heat, that is electrically connected to at least one first or second actuation regions. In some embodiments the dissipation element may be connected in series to the first or second actuation regions at one side and to a voltage source, which is configured to provide the actuation voltage, at its other side. In some other embodiments, the dissipation element may be connected in parallel such that most of the electrical current passes therethrough. The dissipation element is configured such that upon oscillation of the first member energy is dissipated therethrough to obtain a quality factor of the first member lower than 1000, 500, 400, 300, 200, 100, 90, 80, 70, 60, 50, 40, 30, 20 or 10, or 1, thereby reducing stabilization time upon actuating the tunable filter to a desired gap.

In some embodiments of the tunable filter, the dissipation element is a resistor electrically connected in series from one side to at least one first or second actuation regions and from the other side to a voltage source. Namely, the resistor is disposed in an electrical circuit with the first and second actuation regions, connecting at least one of them to the voltage source that is configured to provide the voltage signal for actuation such that electric charges from the voltage source reach the actuation regions, and vice versa, pass through the resistor.

In some embodiments of the tunable filer or the system or the above described system, the dissipation element is a controllable variable resistor configured to controllably change its resistance based on values of at least one characteristic parameter of the tunable filter.

In some embodiments of the tunable filer or the system, the at least on characteristic parameter is internal pressure within an enclosure enclosing the first movable member.

In some embodiments of the tunable filer or the system, the resistance of the variable resistor is configured to be reduced in response to an increase of the internal pressure.

In some embodiments, the tunable filter or the system include a processing circuitry configured to control the variable resistor in response to input data indicative of the at least one characteristic parameter.

In some embodiments of the tunable filter or the system, the processing circuitry is configured to reduce the resistance of the variable resistor in response to an input data indicative of an increase of the internal pressure of the tunable filter.

EMBODIMENTS

The following are non-limiting embodiments of the present disclosure.

1. A method for operating a device that comprises a microelectromechanical (MEMS) tunable filter and an image sensor, the method comprises:
   supplying, during a stabilization determination period, at least one actuation signal to the MEMS tunable filter for setting a gap between optical elements of the MEMS tunable filter;
   acquiring images, by the image sensor, at different points of time during the stabilization determination period, wherein the acquiring of the images starts before the gap stabilizes; and
   determining a stabilization period of the gap based on at least a subset of pixels of the images.
2. The method according to embodiment 1 wherein the determining of the stabilization period comprises searching for regions of consecutive images that correspond to a same area in space that are substantially identical to each other.
3. The method according to embodiment 1 comprising determining when to start the acquiring of the images based on an estimated stabilization period of the gap.
4. The method according to embodiment 1 comprising determining a value of each one of the at least one actuation signal.
5. The method according to embodiment 4 wherein the determining of value of each one of the at least one actuation signal is responsive to an ambient temperature.
6. The method according to embodiment 1, comprising measuring, during a capacitance determination period, a capacitance between electrodes related to the optical elements.
7. The method according to embodiment 1, comprising providing, during a capacitance determination period, at least one actuation signal to electrodes coupled to the optical elements; waiting for at least the stabilization period; and measuring, following the waiting and during the capacitance determination period, the capacitance between the electrodes related to the optical elements.
8. The method according to embodiment 1, comprising: maintaining, by an enclosure of the MEMS tunable filter, a pressure difference between an ambient pressure level and a pressure level that exists in an internal space defined by the enclosure; wherein one or more of the optical elements is located within the internal space.
9. The method according to embodiment 8 comprising:
   measuring, during a pressure level determination period, a capacitance between electrodes related to the optical elements; and
   determining the pressure level that exists in the internal space based on the capacitance between the electrodes related to the optical elements.
10. The method according to embodiment 8 comprising:
    performing, during different points in time of a gap monitoring period, different measurements of a capacitance between electrodes related to the optical elements; and
    searching for capacitance measurement results that are indicative of vibrations of the optical elements.
11. The method according to embodiment 8 wherein the searching comprises searching for a repetitive change in the capacitance measurement results.
12. The method according to embodiment 1, comprising damping vibrations of the optical elements.
13. The method according to embodiment 1, comprising damping vibrations of the gap by supplying actuation signals to electrodes related to the optical elements; wherein each actuation signal is supplied by a path that comprises a resistor.
14. The method according to embodiment 1, comprising damping vibrations of the gap by supplying a first actuation signal to a first electrode related to a first optical element of the optical elements; wherein the first actuation signal is supplied by a path that comprises a first resistor that is serially coupled to the first electrode.
15. The method according to embodiment 1, comprising damping vibrations of the gap by supplying a first actuation signal to a first electrode related to a first optical element of the optical elements; wherein the first actuation signal is supplied by a path that comprises a first resistor that is parallelly coupled to the first electrode.
16. The method according to embodiment 1, comprising damping vibrations of the gap by supplying a first actuation signal to a first electrode related to a first optical element of the optical elements; wherein the first actuation signal is supplied by a path that comprises a first variable resistor that is coupled to the first electrode.
17. The method according to embodiment 1, comprising:
    maintaining, by an enclosure of the MEMS tunable filter, a pressure difference between an ambient pressure level and a pressure level that exists in an internal space defined by the enclosure; wherein one or more of the optical elements is located within the internal space;
    supplying, during a pressure level determination period, at least one actuation signal to the MEMS tunable filter for setting the gap;

acquiring images, by the image sensor, at different points of time during the pressure level determination period, following the supplying of the at least one actuation signal; and determining a pressure level that exists in the internal space based on at least a subset of pixels of the images obtained during the pressure level determination period.

18. The method according to embodiment 17 wherein the determining comprises searching for pixel values that are indicative of vibrations of the gap.

19. The method according to embodiment 18 wherein the searching is followed by determining a period of the vibrations and determining the pressure level based on the period of the vibrations.

20. The method according to embodiment 1, comprising:
maintaining, by an enclosure of the MEMS tunable filter, a pressure difference between an ambient pressure level and a pressure level that exists in an internal space defined by the enclosure; wherein one or more of the optical elements is located within the internal space; and repeating, for each sub-period of a pressure level determination period, the steps of:

supplying, at a beginning of the each sub-period, at least one actuation signal to the MEMS tunable filter for setting the gap;

acquiring images, by the image sensor, at different points of time during the each sub-period, following the supplying, at the beginning of the each sub-period, of the at least one actuation signal; and wherein the method further comprises determining a pressure level that exists in the internal space based on at least a subset of pixels of the images obtained during the pressure level determination period.

21. The method according to embodiment 20 wherein the acquiring of the images, at different points of time during the each sub-period, occurs at a rate that does not exceed 16,000 frames per second.

22. The method according to embodiment 20 wherein the acquiring of the images, at different points of time during the each sub-period, occurs at a rate that does not exceed 8,000 frames per second.

23. The method according to embodiment 20 wherein the determining comprises searching for pixel values that are indicative of vibrations of the gap.

24. The method according to embodiment 23 wherein the searching is followed by determining a period of the vibrations and determining the pressure level based on the period of the vibrations.

25. The method according to embodiment 1 comprising individually supplying hybrid signals, during a gap evaluation period, to each electrode out of (a) a first group of electrodes that are related to a first optical element of the optical elements, and (b) a second group of electrodes that are related to a second optical element of the optical elements; wherein each hybrid signal includes a direct current (DC) component and an alternate current (AC) component.

26. The method according to embodiment 25 comprising performing, during different points in time of the gap evaluation period, different measurements of a capacitance of each of the electrodes; and evaluating one or more dimensional parameters of the gap based on the different measurements of the capacitance of each of the electrodes.

27. The method according to embodiment 26 wherein the performing of the different measurements of the capacitance of each of the electrodes comprises (a) measuring signals received from each of the electrodes, and (b) estimating the capacitance of each of the electrodes based on the signals received from each of the electrodes.

28. The method according to embodiment 27 comprising measuring, for each electrode, a difference between (a) a peak to peak amplitude of a hybrid signal supplied to the electrode, and (b) a peak to peak amplitude of a signal received from the electrode; and determining the one or more dimensional parameters of the gap based in differences related to at least some of the first and second groups of electrodes.

29. The method according to embodiment 27 comprising calculating a difference signal, for each electrode by subtracting, the signal received from the electrode from the hybrid signal supplied to the electrode; and determining the one or more dimensional parameters of the gap based in difference signals related to at least some of the first and second groups of electrodes.

30. A method for operating a device that comprises a microelectromechanical (MEMS) tunable filter and an image sensor, the method comprises:
maintaining, by an enclosure of the MEMS tunable filter, a pressure difference between an ambient pressure level and a pressure level that exists in an internal space defined by the enclosure; wherein one or more optical elements out of multiple optical elements of the MEMS tunable filter are located within the internal space; wherein the multiple optical elements are spaced apart from each other by one or more gaps; wherein the one or more gaps determine a spectral response of the MEMS tunable filter;

repeating, for each sub-period of a pressure level determination period, the steps of:

supplying, at a beginning of the each sub-period, at least one actuation signal to the MEMS tunable filter for setting the gap;

acquiring images, by the image sensor, at different points of time during the each sub-period, following the supplying, at the beginning of the each sub-period, of the at least one actuation signal; and wherein the method further comprises determining a pressure level that exists in the internal space based on at least a subset of pixels of the images obtained during the pressure level determination period.

31. The method according to embodiment 30 wherein the determining comprises searching for pixel values that are indicative of vibrations of the gap.

32. The method according to embodiment 31 wherein the searching is followed by determining a period of the vibrations and determining the pressure level based on the period of the vibrations.

33. A method for operating a device that comprises a microelectromechanical (MEMS) tunable filter and an image sensor, the method comprises:
maintaining, by an enclosure of the MEMS tunable filter, a pressure difference between an ambient pressure level and a pressure level that exists in an internal space defined by the enclosure; wherein one or more optical elements of multiple optical elements of the MEMS tunable filter are located within the internal space; wherein the multiple optical elements are spaced apart from each other by one or more gaps;

supplying, during a pressure level determination period, at least one actuation signal to the MEMS tunable filter for setting the one or more gap;

acquiring images, by the image sensor, at different points of time during the pressure level determination period, following the supplying of the at least one actuation signal; and determining a pressure level that exists in the internal space based on at least a subset of pixels of the images obtained during the pressure level determination period.

34. The method according to embodiment 33 wherein the determining comprises searching for pixel values that are indicative of vibrations of the optical elements.

35. The method according to embodiment 33 wherein the one or more gaps determine a spectral response of the MEMS tunable filter.

36. A method for operating a device that comprises a microelectromechanical (MEMS) tunable filter and an image sensor, the method comprises:

maintaining, by an enclosure of the MEMS tunable filter, a pressure difference between an ambient pressure level and a pressure level that exists in an internal space defined by the enclosure; wherein one or more of the optical elements of the MEMS tunable filter are located within the internal space;

performing, during different points in time of a gap monitoring period, different measurements of a capacitance between electrodes related to the optical elements; and searching for capacitance measurement results that are indicative of vibrations of the one or more optical elements.

37. A method for operating a device that comprises a microelectromechanical (MEMS) tunable filter and an image sensor, the method comprises:

maintaining, by an enclosure of the MEMS tunable filter, a pressure difference between an ambient pressure level and a pressure level that exists in an internal space defined by the enclosure; wherein optical elements of the MEMS tunable filter are located within the internal space;

supplying, during a pressure level determination period, at least one actuation signal to the MEMS tunable filter for setting a gap between the optical elements;

acquiring images, by the image sensor, at different points of time during the pressure level determination period, following the supplying of the at least one actuation signal; and determining a pressure level that exists in the internal space based on at least a subset of pixels of the images obtained during the pressure level determination period.

38. A method for operating a device that comprises a microelectromechanical (MEMS) tunable filter and an image sensor, the method comprises:

maintaining, by an enclosure of the MEMS tunable filter, a pressure difference between an ambient pressure level and a pressure level that exists in an internal space defined by the enclosure; and repeating, for each sub-period of a pressure level determination period, the steps of:

supplying, at a beginning of the each sub-period, at least one actuation signal to the MEMS tunable filter for setting a gap between optical elements of the MEMS tunable filter that are located within the internal space;

acquiring images, by the image sensor, at different points of time during the each sub-period, following the supplying, at the beginning of the each sub-period, of the at least one actuation signal; and wherein the method further comprises determining a pressure level that exists in the internal space based on at least a subset of pixels of the images obtained during the pressure level determination period.

BRIEF DESCRIPTION OF THE DRAWINGS

In order to understand the invention and to see how it may be carried out in practice, a preferred embodiment will now be described, by way of non-limiting example only, with reference to the accompanying drawings.

FIG. 1 is an example of a method;
FIG. 2 is an example of a method;
FIG. 12 is an example of a tunable filter;
FIG. 17A shows an example of the signal channel and FIG. 17B shows an example of the reference channel.

DETAILED DESCRIPTION OF THE DRAWINGS

Figure 4:
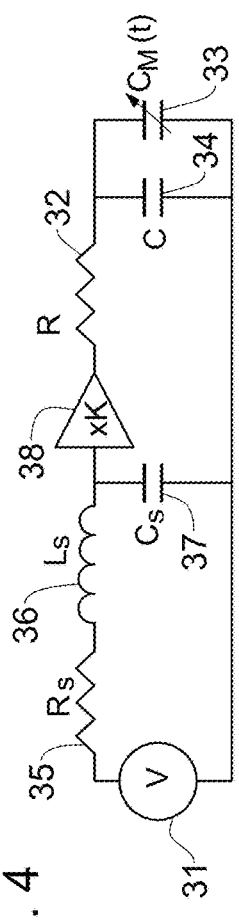
FIG. 4 is an example of a model of a circuit.

The term "and/or" is additionally or alternatively.

Each one of the figures may be of scale or may be out of scale.

Any reference to a device or to a tunable filter should be applied, mutatis mutandis to a method that is executed by a device or tunable filter.

Any reference to method should be applied, mutatis mutandis to a device or to a tunable filter that is configured to execute the method.

There may be provided a device that includes MEMS tunable filter. The MEMS tunable filter may include optical elements. There may be multiple gaps between the multiple optical devices, wherein the gaps may determine a spectral response of the MEMS tunable filter. For example—changing a gap may change the bandpass frequency range of the tunable filter.

For simplicity of explanation a reference is made to a single gap that determines the spectral response of the MEMS tunable filter. It should be noted that at least one optical elements that define the gap may be a movable optical element. One other optical element that defines the gap may be static or movable.

The optical elements may be related to actuation regions or electrodes—in the sense that the may be connected to the electrodes or include the electrodes. One or more actuation signals supplied to the electrodes may set the gap.

It is to be noted that throughout the application, the term "actuation region" refers to a region that is disposed on or in association with an optical member and is configured to perform actuation together with a respective actuation region of a different optical member to bring the tunable filter to a desired optical gap. For example, the term "actuation region" may refer to an electrode that is configured for electrostatic actuation with its respective electrode of a different optical member. By applying a voltage difference between the two electrodes, a movable optical member moves and set in a desired optical gap. Therefore, throughout the application, the term "actuation region" is exemplified by reference to electrodes disposed on or associated with one of the optical members.

The device includes an image sensor. The MEMS tunable filter precedes the image sensor in the sense that radiation passes through the MEMS tunable sensor before reaching the image sensor.

The image sensor may be configured to acquire images. The image sensor may include sensing elements that corresponds to pixels.

Some of the listed below methods may process images and/or subsets of images. A subset of an image is acquired by only some of the sensing elements. A subset of an image may be sensed by a subset of the sensing elements—wherein the subset of the sensing elements may form one or more columns, one or more rows, a part of a row, a part of a column, or any other combination of sensing elements. Accordingly—a subset of an image may include any arrangement of pixels. The subset of the image may be of any shape and/or any size.

For simplicity of explanation, any reference to an image may be applied mutatis mutandis to any subset of the image and any reference to a subset of an image may be applied to an image.

Processing a subset of an image instead of the entire image may reduce the readout time, and may save processing and/or storage resources.

When pixels of different images are compared to each other is assumed that the different images capture radiation from the same scenery.

There may be provided a method for measuring a stabilization time of the gap.

The method may include (a) setting an actuation signal, (b) capturing a sequence of images in predetermined time intervals (at least two images), (c) comparing the images to identify whether at least a common region of the images (that also captures a same region in space) is substantially identical, and (d) determining whether the system reached stabilization by time of capturing the second image.

There may be provided a method for reducing the stabilization time of the gap. The method may include adding a resistor to a supply path that supplies an actuation signal to an electrode related to an optical elements that defines (at least in part) the gap. The resistor may be a variable resistor or a non-variable resistor. The resistor may be connected in a series or parallel to one or more electrode that may supply an actuation signal.

The device may include (or may be coupled to) a controller (also referred to as a control unit) that may be configured to vary the resistance of the resistor in accordance with the interior pressure of the MEMS device. The resistance may be varied according to a predicted leaking rate, which is indicative to the varied interior pressure in time.

There may be provided a method of measuring the internal pressure of the MEMS device, the method may include: (a) applying an actuation signal on the movable optical element to set an optical gap, (b) capturing a plurality of consecutive images by an imaging device comprising the MEMS device, (c) analyzing at least a region of the images to identify a periodical profile indicative of the period time of vibrations of the movable optical element, and (d) translating the period time of vibrations to the internal pressure.

The control unit may be configured to apply an actuation signal on the electrodes and measuring the capacitance between the electrodes, that is indicative of the optical gap There may be provided a method that may include (i) applying an actuating signal which is a direct current (DC) signal thereby providing a static electric field/voltage between each of the electrodes and the movable optical element for triggering a movement of the latter; (ii) applying an alternating current (AC) signal between each electrode and the movable optical element that is added to the DC signal of each electrode, the AC signal is identical for each electrode, and (iii) detecting the variation profile of an AC signal received from the electrodes, and (iv) compare to a reference signal, the variation profile is indicative to the capacitance of each electrode.

The capacitance is indicative of the gap between each electrode and at least a portion of the movable optical element.

The method may include applying the DC signal and the AC signal between a movable optical element and each of the electrodes.

The MEMS device is manufactured so as to be sealed to the ambient environment. In order to reduce the actuation time, namely the time that takes the device to reach a desired state (e.g. gap), it is sealed in vacuum conditions. The low pressure within the device results in reduced damping forces and the movable optical element of the device moves with less resistance than in ambient pressure conditions. However, the vacuum conditions within the device are not maintained static, due to a certain leak rate. Thus, the pressure within the device rises over time and so do the damping forces applied on the movable optical element during actuation. This results in variations in the expected stabilization time for each desired actuation gap. Therefore, the stabilization time needs to be determined through the "life cycle" of the MEMS device and the stabilization time is measured periodically, namely once in a predetermined time period (e.g. a day, a week, a month or even a year) and updated accordingly.

FIG. 1 illustrates method 10 for determining gap stabilization based on images.

Method 10 includes: (a) determining a desired optical gap (11), (b) applying an electrostatic voltage (at least one actuation signal) that should cause the MEMS tunable filter to define the desired optical gap between the electrodes (12), (c) acquiring a sequence of images (14), (d) searching two or more consecutive images (of the image acquired during step 14) are substantially equal to one another (16), and (e) determining (18) the stabilization period based on the timing of acquisition of an image (that differs from the first image) of the two or more consecutive images are substantially equal to each other. For example—the gap may be deemed stable when the second image is acquired.

Two or more consecutive images may be regarded substantially equal to each other if a certain amount of pixels have intensities that may differ from each other by up to one percent or few percent. Few percent may range between 2 and 30 percent. For example—two consecutive images may be regarded substantially equal to each other if out of 1000 pixels, the intensities of 900 or more pixels are in the range of one percent between one image to the other. The percent of pixels that have similar intensity may be defined in any manner and may be defined based on the accuracy level of the stabilization period determination.

The gap may be set to be of different widths—and the stabilization periods regarding the different widths (of for different gap width changes) may be determined. The desired gap size may be changed between all of the different widths, may be changed between only a subset of all of these widths, or may be changed according to all (or only a subset) of the different gap width changes.

The at least one actuation signal to cause the MEMS tunable filter to define the desired gap may be calculated in one or more manners. For example—the calculation may take into account one or more ambient conditions, the actual or estimated pressure level within the MEMS tunable filter, the lifespan of the MEMS tunable filter, the age of the MEMS tunable filter, the manner in which the MEMS tunable filter was used in the past, and the like.

The at least one actuation signal to cause the MEMS tunable filter to define the desired gap may be calculated based on the actual geometric characteristics of the optical components (e.g. the alignment of a movable optical element with respect to a surface of the electrodes formed in a fixed optical element) and the biasing force of the springs that are connected to the movable element.

Step 16 may be executed in a partially overlapping manner to step 14—so as to stop step 14 following the detection of the two or more consecutive images that are substantially equal to each other.

Alternatively—step 14 can be defined (for example based on an expected stabilization period) to be long enough to span even after the actual stabilization—and may be stopped after the long enough period ends.

The method may include updating a minimum stabilization time per gap width, any time the two consecutive images are not identical, up to a predetermined threshold.

Step 18 may be followed by responding to the determination (19).

Step 19 may include sending an indication of the stabilization time, sending an alert when the measured stabilization time differs by at least a certain amount from the expected stabilization time.

Step 19 may include measuring the capacitance between the electrodes to verify that the capacitance is as expected, which indicates that the desired optical gap is set.

If the capacitance deviates from the expected value, in at least one of the electrodes, an alert in the device may be executed. It is to be noted that an alert can be interpreted as any output of the device that may present or notify the user or other components of the device of a potential malfunction.

Step 19 may include determining, based on the stabilization time, the internal pressure of the MEMS tunable filter. The relationship between the stabilization time and the internal pressure may be predefined and/or determined in any manner.

Step 19 may include or may be followed by acquiring one or more images. The MEMS tunable filter may function in association with the image sensor to acquire images—for example during hyperspectral imaging.

FIG. 2 illustrates method 20 for operating the device that includes an image sensor and the MEMS tunable filter.

Method 20 may include: (a) step 21 of determining the desired optical gap and the one or more activation signals that are required for such a gap, (b) step 23 of applying the one or more activation voltages and providing the desired optical gap, (c) step 25 of measuring the capacitance from the initiation of the applied voltage or only after a predetermined stabilization time previously measured, (d) step 27 of responding to the capacitance—if the capacitance is indicative of the described desired gap (or a tolerable deviation from the desired gap)—then step 27 may include acquiring one or more images—else step 27 may include generating an alert.

Step 25 may be repeated multiple times to detect oscillations of the movable optical element around the desired optical gap, and in case where the capacitance varies above a predetermined threshold, an alert may be generated.

The predefined threshold may be dependent on the application—the manner in which the device is used. For example—if the MEMS device serves for hyperspectral imaging then the predefined threshold may be smaller (for example about 0.5 nm) that the predefined threshold required when the MEMS device serves as a MEMS tunable filter (for example about 5 nm). The predefined threshold may differ from 5 and 0.5 nm respectively—for example may range between 0.3 and 10 nanometers.

The predetermined threshold may be set as a certain percentage from the steady state capacitance when the gap stabilizes. The percentage may be one percent, lower than one percent or more than one percent. The percentage may depend on the application.

There may be provided a method for reducing stabilization time. The reduction of the stabilization time may be included to any of the mentioned above or mentioned below.

During actuation, the movable optical element may oscillate around the desired optical gap due to low damping forces (for example, when the interior pressure of the device is relatively low). Due to these oscillations, there are corresponding oscillations of the voltages between the electrodes. By controlling the voltages oscillations, the stabilization time can be reduced. To this end, a controllable electric component, such as a resistor, can be connected to the circuit including the electrodes, which constitute capacitors in the device, for dissipating the energy of the electrical circuit therethrough, thereby reducing the oscillation of the voltages and accordingly the stabilization time.

The resistor may be connected at one side to the voltage source and at the other side to an electrode. This way each time the current fluctuates and flow through resistor, some of the energy dissipates.

The resistor may be a controllable variable resistor connected in series or in parallel to the circuit comprising at least one pair of electrodes, and controlled to vary according to the interior pressure of the MEMS device, such that with the increase of the pressure, the resistance of the resistor decreases until reaches a threshold in which the electronic circuit is switched to bypass the resistor.

Figure 3:
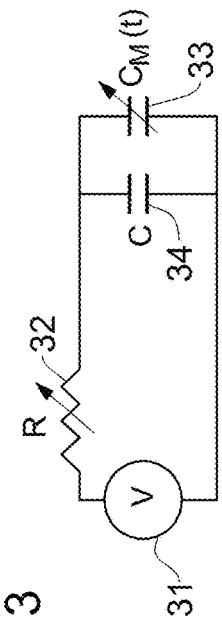
FIG. 3 is an example of a model of a circuit.

FIG. 3 is a schematic illustration of such a circuit where V 31 is the power source, R 32 is the variable resistor, $C_M(t)$ 33 is the capacitor of the MEMS device (the electrodes) and C 34 is a static capacitor (parasite capacitor). The parasite capacitor is the expression of a "byproduct" of the electrical components of device.

The MEMS device may include multiple electrodes. Each electrode may be electrically coupled to a different resistor. Alternatively, one or more electrodes are coupled to the same resistor. For example—when each electrode has its own circuit (to permit differential voltage appliance between the electrodes) than a resistor may be connected to each circuit independently.

FIG. 4 is an expanded drawing of the above circuit—is also includes circuit components $R_s$ 35, $L_s$ 36, and $C_s$ 37 of the power source V and also includes a buffer 38 denoted xK.

Figure 5:
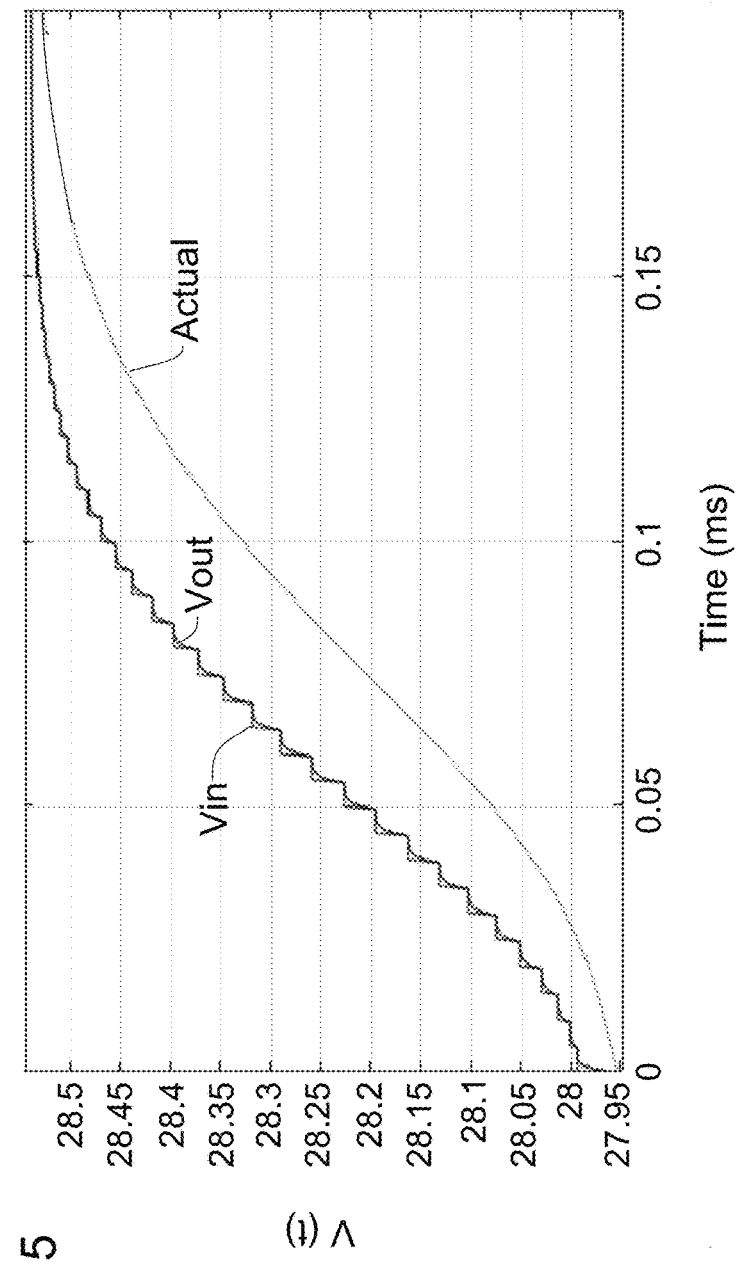
FIG. 5 is an example of a voltage versus time relationship.

FIG. 5 illustrates the change of various voltages over time.

Curve 41 represent Vin—the voltage produced by the power source/supply, curve 42 represents Vout—the voltage passes the buffer, and curve 42 represents Actual—the actual voltage which falls on the electrodes of the MEMS device.

There may be provided a method for determining the internal pressure of the MEMS device.

The internal pressure of the MEMS device varies in time due to leak rate. While this leak rate may be predicted over time, it may be beneficial to verify the actual pressure at certain times. Since a pressure sensor cannot fit within the MEMS device due to lack of space, there is a need of an alternative way of measuring the internal pressure thereof.

Therefore, in order determine the internal pressure, an actuation signal is applied on the movable optical element, causing it to move to a certain optical gap. The movement of the movable optical element during actuation is characterized in resonating oscillations due to squeeze-film phenomena, which their period is indicative of the internal pressure. It derives from the solution of the differential equation of oscillator.

To identify the period of these vibrations, a series of images are captured during the actuation, starting at a predetermined initiation time and ending at a predetermined end time. The initiation and end times are predetermined by the characteristic of the actuation time.

Since the MEMS device may store the information about the time takes the movable optical element to reach the set optical gap, the imaging may be carried out at the first third or half of the actuation period, where the resonating oscillations are the most discernible. Therefore, the imaging may begin with the application of the actuation signal and stop at the third or half of the stabilization time. However, the imaging can also begin right with the initiation of the actuation signal but then some of the first images will have to be discarded.

In order to avoid aliasing, the images are captured in frequencies above the expected vibrations period time, namely above the Nyquist frequency of the vibrations of the movable optical element.

By a non-limiting example, the image capturing frequencies can be above 32,000, 40,000 or even above 60,000 Hz. It may be desired to reduce the required the image capturing frequencies, so it would be feasible to capture the images with a relatively standard imaging device. To this end, consecutive actuation signals are performed such that the vibration time required for this measurement lingers to permit imaging with relatively low rate, e.g. below 16,000 frames per second or even below 8,000 frames per second. Thus, for each sub-period out of multiple sub-periods, an actuation signal may be provided and images may be acquired.

The captured images are analyzed to identify periodical profile in at least a region of the captured images, this periodical profile comprises data indicative of the period of vibrations of the movable optical element, which is related to the internal pressure mathematically. In other words, the periodical profile may be identified as a repetition of detected light intensities in a subset of an image.

After determining the vibrations' period (the first resonant frequency), the internal pressure of the MEMS device can be deduced therefrom, based on a known or calculated relationship.

By determining higher resonant frequencies of the movable optical element (e.g. second resonant frequency), other parameters of the device may be obtained independently, e.g. optical gap. Since the optical gap is a parameter that is required for the relationship between the resonant frequency and the internal pressure, in case it is not known, the equation turns to a two variables equation. Thus, knowing two orders of resonant frequencies may solve the equation and the internal pressure and the optical gap may be determined.

It should be noted that the internal pressure can be also deduced from the stabilization time. The stabilization time is related to the internal pressure. Once the stabilization time is determined, the internal pressure of the MEMS device can be concluded, e.g. by a predetermined look-up table or by any other manner.

There may be provided a method for actuating the MEMS tunable filter and measuring the capacitance between of the electrodes thereof.

The MEMS tunable filter may be used for hyperspectral imaging that requires the ability of filtering desired spectrum in each image, namely obtaining a specific transmission window—and change the spectral response of the filter very quickly between one sets of images to another.

A movable optical element may be connected to one or more electrodes—for example to four electrodes. Any other number of electrodes may be provided.

Different electrodes apply electrostatic forces on different portion of the movable optical element. In this manner, the movement of the movable optical element can be controlled in three degrees of freedom.

It should be noted that applying force on three or more different positions of the movable optical element allows a complete three-dimension control thereof. When using four different electrodes—the movable optical element can move spatially (at least along the Z axis), can be tilted, rolled or yawed.

It is to be noted, that the movable optical element can be manipulated in three degrees of freedom with less electrodes, e.g. 2 or 3. Since there is a requirement for high degree of accuracy, specifically of the desired optical gap and parallelism between the two reflecting surfaces (e.g. on the order of a $10^{th}$ of a percent), there is a need to continuously monitor and control the applied voltage between each of the electrodes and the movable optical element. Furthermore, the description below provides an example for determining the capacitance of the electrodes, which can be used in the method mentioned above of determining the stabilization time.

There may be provided a method for determining the capacitance of each electrode and deducing the optical gap therefrom.

The method may include (i) applying a DC signal (static electric field/voltage) between each of the electrodes and the movable optical element for triggering a movement of the latter; (ii) applying an AC signal, between each electrode and the movable optical element that is added to the DC signal of each electrode, (ii) Detecting the variation profile of the AC signal, affected by the capacitance on each electrode, and comparing it to a reference signal. The variation profile of the AC signal, detected for each electrode, is indicative to the capacitance thereof.

The AC signal should be much higher than the resonant frequency of the MEMS, which is between 13-15 KHz. Currently, we use an AC signal with a frequency of 300 KHz. However, the signal may be much lower, e.g. about 30, 50 or 100 KHz.

The AC signal should not induce any resonating effects in the MEMS.

In general the supplied AC signal is attenuated in an amount indicative to the current capacitance between the electrodes.

The capacitance is indicative of the gap between each electrode and at least a portion of the movable optical element (the portion which the measurement of the capacitance is taken).

Each electrode may receive a dedicated hybrid signal that includes the AC and DC signals (also referred to as AC and DC components). The method may include determining the gap based on other parameters—such as temperature and/or pressure sensor. Such an additional temperature or pressure sensor may or may not be provided. The pressure difference between the ambient pressure and the internal pressure may have a (usually minor) effect of the response of the movement of the movable member. An external pressure sensor may be used to measure the ambient pressure.

The MEMS device may include a control unit that may be in data communication with at least one of a temperature sensor and a pressure sensor. Variation in the pressure and/or the temperature may affect the behavior of the movement of the movable optical element. For example, the higher the temperature, the higher the voltage that needs to be applied to obtain a specific optical gap. Therefore, the data from the temperature and pressure sensors is used to set the initial actuation signals values and the above detailed capacitance measurements are used for verifying the actual state, namely the optical gap in real time.

Figure 6:
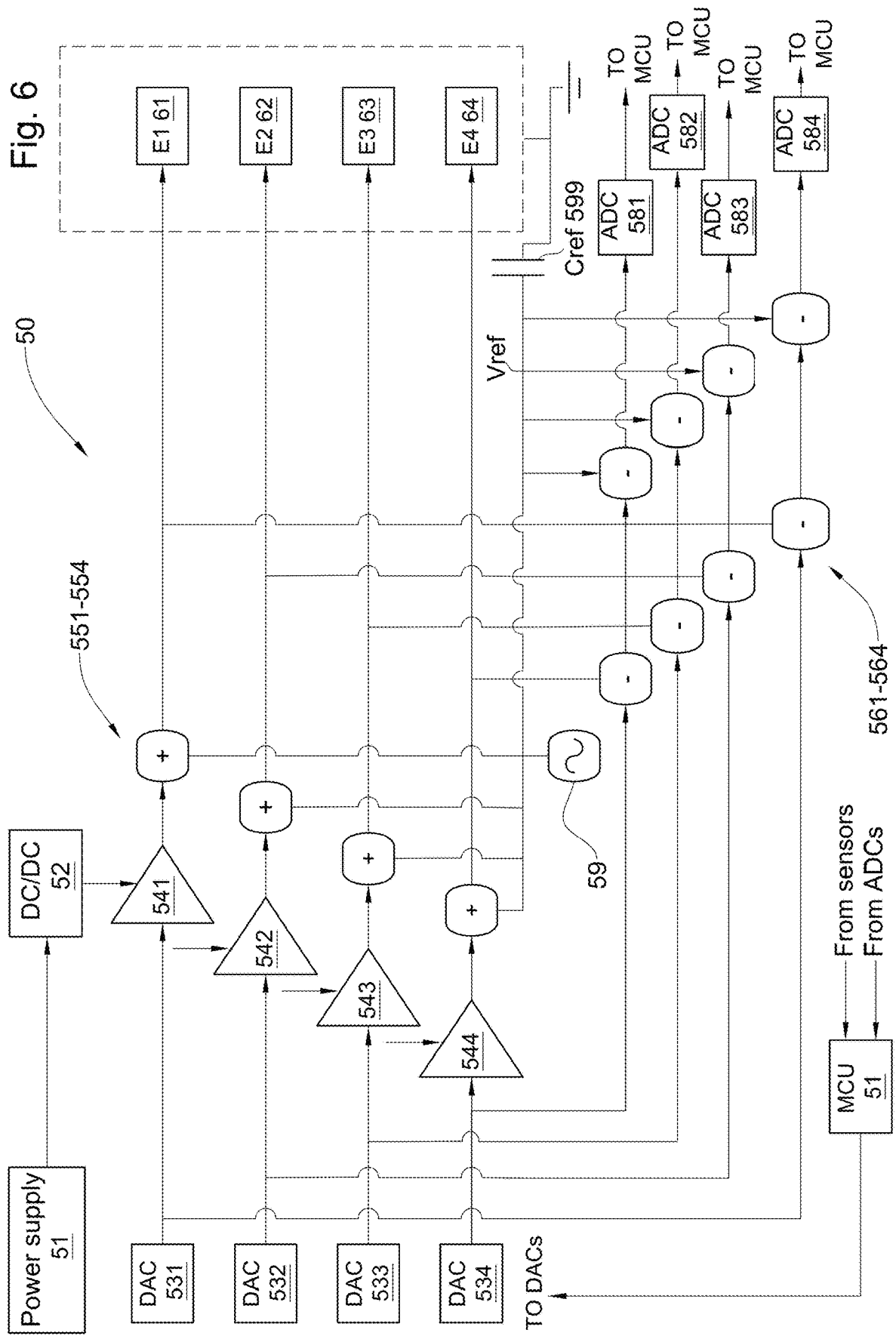
FIG. 6 is an example of a part of a device.

FIG. 6 illustrates a control unit of the MEMS device. It is assumed that there are four electrodes—thus there are four individual supply paths and four individual sensing paths.

A power supply 51 supplies a DC signal to the control unit 50.

A DC/DC converter ("DC/DC") 52 supplied a bias DC signal to amplifiers 541, 542, 543 and 544.

Amplifiers 541-544 receive four different input analog signals from digital to analog converters (DACs) 531, 532, 533 and 534 (that are controlled by MCU 51) may amplify them to provide four output DC signals. Four adders 551, 552, 553 and 554 add the four output DC signals to an AC signal provided by an AC signal generator 59 to provide four hybrid signals.

It should be noted that although FIG. 6 illustrates a single AC signal that is provided to all adders—it should be noted that different adders may receive different AC signals from the AC signal generator 50.

A first hybrid signal is supplied by adder 551 to first electrode E1 61 of the MEMS tunable filter.

A second hybrid signal is supplied by adder 552 to second electrode E2 62 of the MEMS tunable filter.

A third hybrid signal is supplied by adder 553 to third electrode E3 63 of the MEMS tunable filter.

A fourth hybrid signal is supplied by adder 554 to fourth electrode E4 64 of the MEMS tunable filter.

FIG. 6 illustrates a reference signal generator that includes a single capacitor Cref 599 that receives, at one end, the AC signal from AC signal generator 50 and is grounded at its other end. It should be noted that that different references circuits may be provides for different electrodes.

A reference signal may be generated for a group of two or more electrodes as long as their AC signal is identical.

The signal that is retrieved from each of the electrodes is varied according to their capacitance.

The retrieved, sensed, signal (referred throughout the application also as a "resultant signal") of each electrode is subtracted (by subtractors 561, 562, 563 and 564 respectively) by the corresponding DC signal (from the relevant DAC out of DACs 531, 532, 533 and 534) to obtain the AC difference between the AC component of the hybrid signal and the AC component of the sensed signal. The AC difference is then compared to the reference signal Vref. More specifically, the AC difference is subtracted from the reference signal Vref by subtractors 571, 572, 573 and 574 respectively. The resulted signal, namely the variation profile (specifically, the amplitude change) of the AC difference, is indicative of the MEMS state, namely the gap between different electrodes. The AC difference may be indicative of gaps between an electrode and the movable optical element—as an electrode may be coupled to or integrated with a portion of the movable member FIG. 7 exemplifies the determination of the variation profile of the AC component of the signal and FIG. 8 illustrates a circuit.

Figure 7:
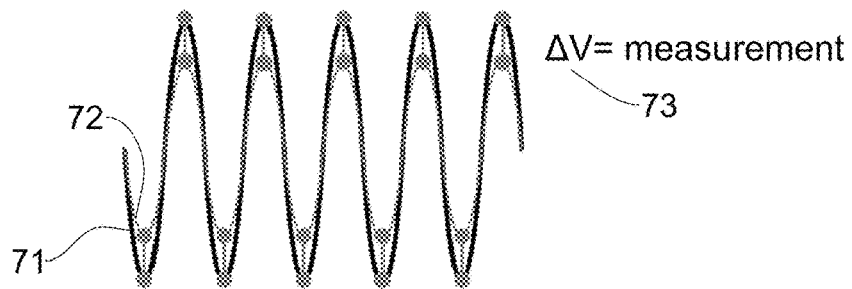
FIG. 7 is an example of a hybrid signal.

FIG. 7 illustrates the difference 73 in voltage amplitude between the Vref reference 71 and the sensed signal 72.

Figure 8:
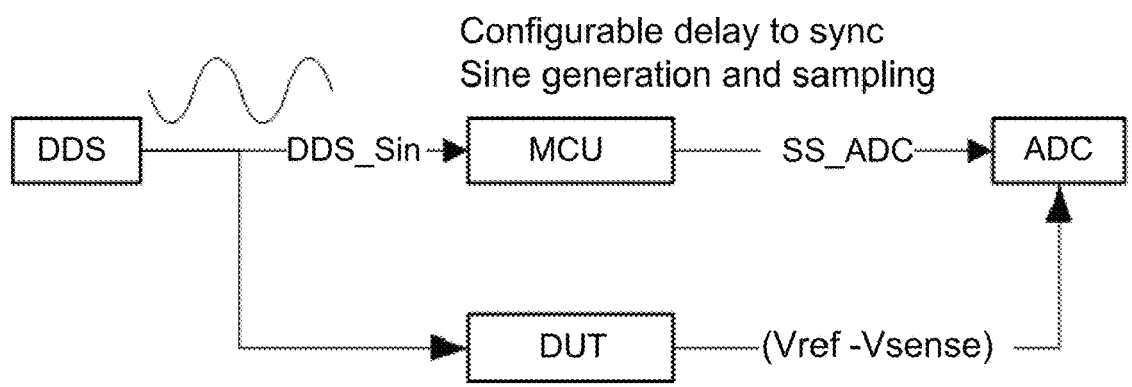
FIG. 8 is an example of part of a device.

FIG. 8 is a schematic description of how the differences between the AC components are sampled: the MCU may sample the digital signals from the ADCs at the time of sine wave peaks of the AC signal generated by the AC signal generator.

The MEMS device is in data communication and/or comprised within an image sensor. Therefore, when the measured capacitance of the electrodes reaches a predetermined range, namely, the desired optical gap has been obtained, the image sensor is operated to capture images with the desired transmission window spectrum.

Using the above technique, the control unit may generate a typical profile of the capacitance Vs the applied voltage out of the collected data for each electrode. In other words, there is an expected and typical behavior of the movable optical element in the presence of specific actuation signals. Any variation from this predetermined profile of the capacitance Vs the applied voltage may indicate an improper or malfunction of the actuation process and mechanism, in one or more of the electrodes. This measurement may also indicate the control unit that a different voltage needs to be applied on the four electrodes to obtain the desired gap. In other words, this method can serve in a monitoring process of the actuation process.

Over time, the expected capacitances at a predetermined gaps may be changed due to minor physical changes in the hardware, parasite capacitances, etc. Therefore, by measuring the capacitances at a known states, the expected capacitance reads values may be updated accordingly. For example, the optical gap at a pull-in state is always constant and by measuring periodically the capacitance at the pull-in state the change of the expected capacitance may be observed. Once a deviation of the expected capacitance at the pull-in state is observed, the expected capacitances for each desired optical gap is updated accordingly. Another state of the MEMS device that may be used for calibration of the expected capacitances may be the non-actuated state. A calibration of the expected capacitance for each optical gap may be determined based on the one or two known optical states—the pull-in and the non-actuated states.

Therefore, the control unit may be configured to perform a calibration process at a desired time, e.g. periodically (once in any hour, day, month), and update the data base that indicates the expected capacitance for each optical gap. The update of the expected capacitance values may be updated with respect to the pre-stress point, which is an initial displacement variation at known position.

Figure 9:
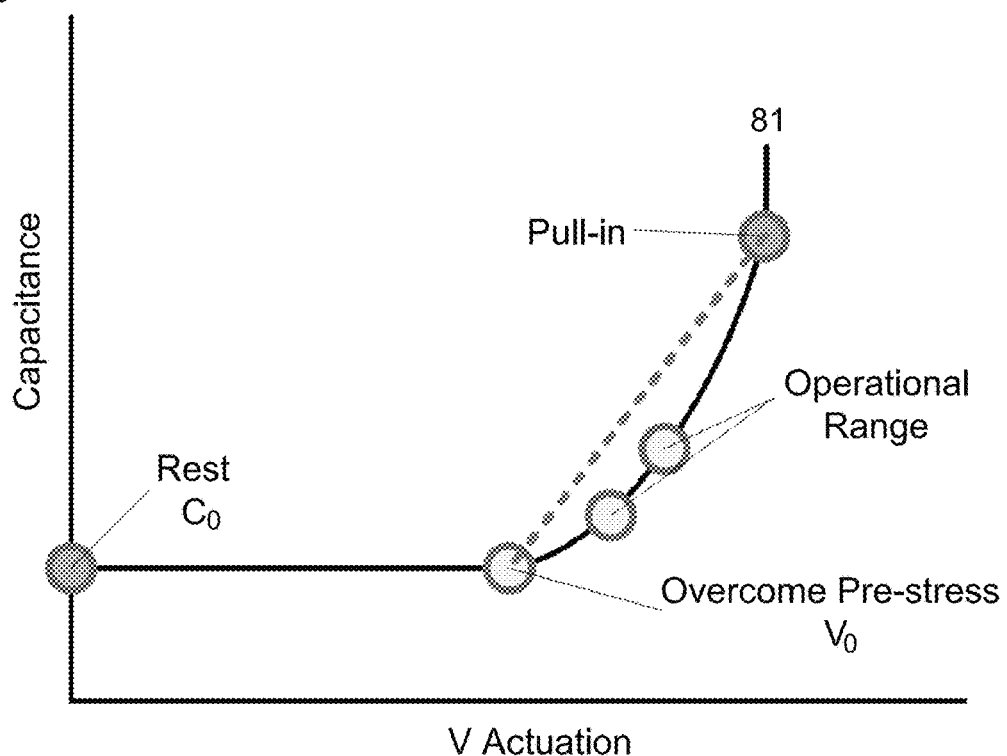
FIG. 9 is an example of a voltage versus capacitance relationship.

FIG. 9 is an example for an anticipated profile 81 of the capacitance versus the applied voltage in one of the electrodes. The curve 81 illustrates various points including (a) pull up—a threshold in which the movable optical element is being pulled towards a static optical element, (b) overcoming pre-stress, and operational range.

Figure 10:
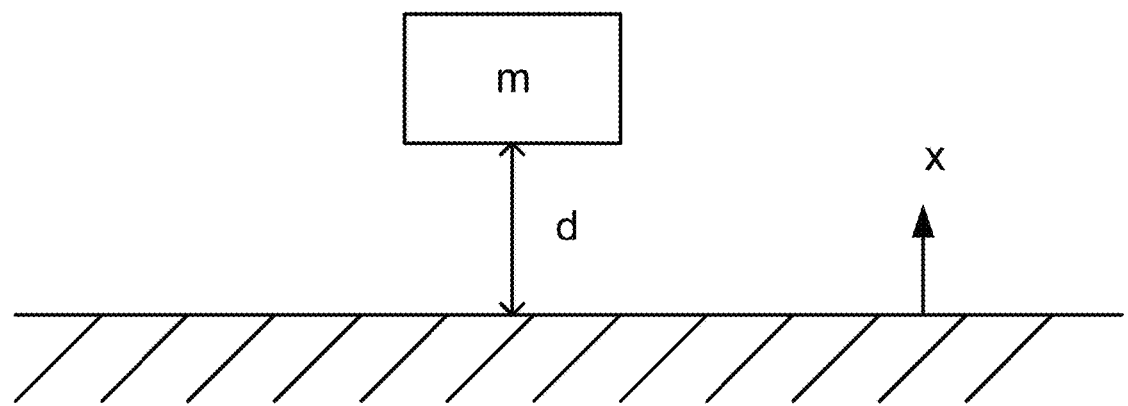
FIG. 10 is an example of a physical model.

FIG. 10 illustrates a model of a movable optical element.

Figure 11:
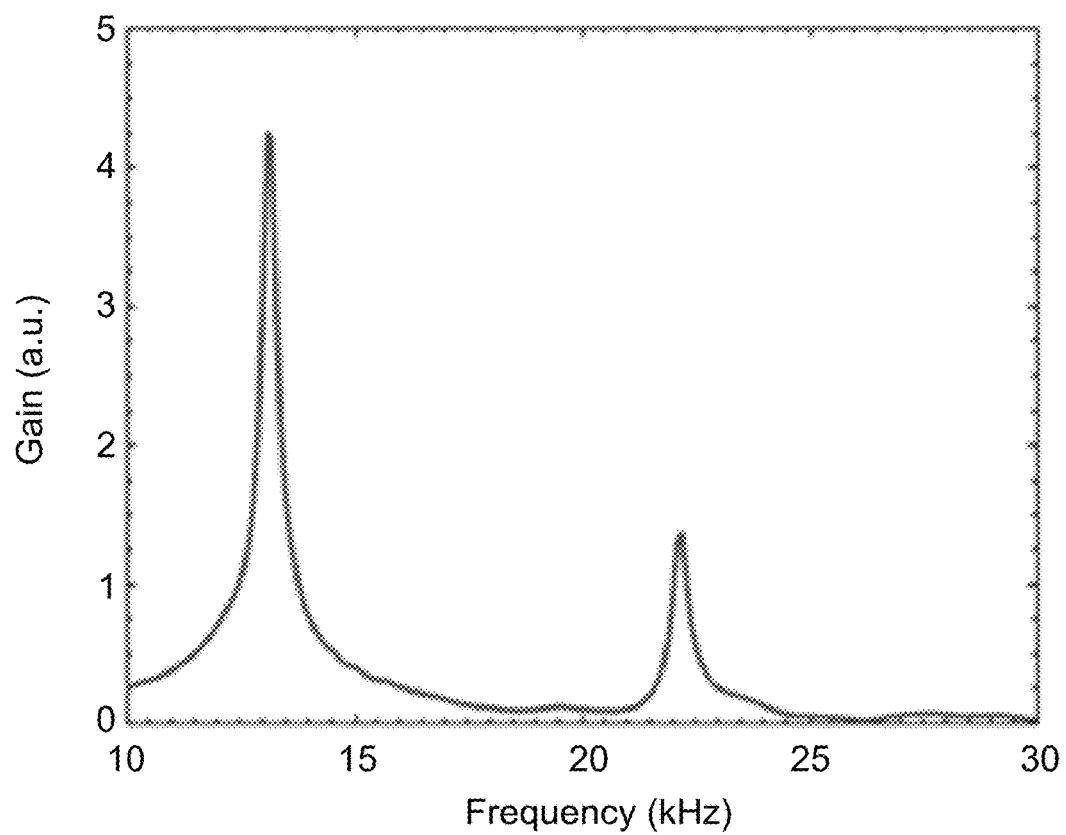
FIG. 11 is an example of a spectrum.

FIG. 11 illustrates a relationship between gain and frequency (please explain the two peaks).

FIG. 12 illustrates a movable optical element, springs connected to the movable optical element, a frame connected to the spring, electrodes, vias, pads and the like.

Figure 13:
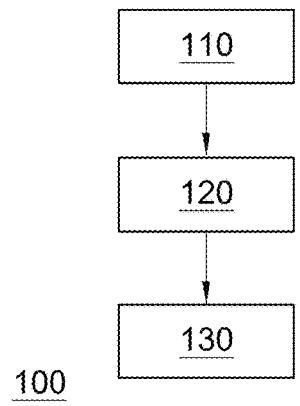
FIG. 13 is an example of a method.

FIG. 13 illustrates method 100.

Method 100 may be for operating a device that comprises a microelectromechanical (MEMS) tunable filter and an image sensor.

Method 100 may include:
a. Supplying, during a stabilization determination period, at least one actuation signal to the MEMS tunable filter for setting a gap between optical elements of the MEMS tunable filter (S110).
b. Acquiring images, by the image sensor, at different points of time during the stabilization determination period, wherein the acquiring of the images starts before the gap stabilizes (S120).
c. Determining a stabilization period of the gap based on at least a subset of pixels of the images (S130).

Determining the internal pressure of the MEMS

Figure 14:
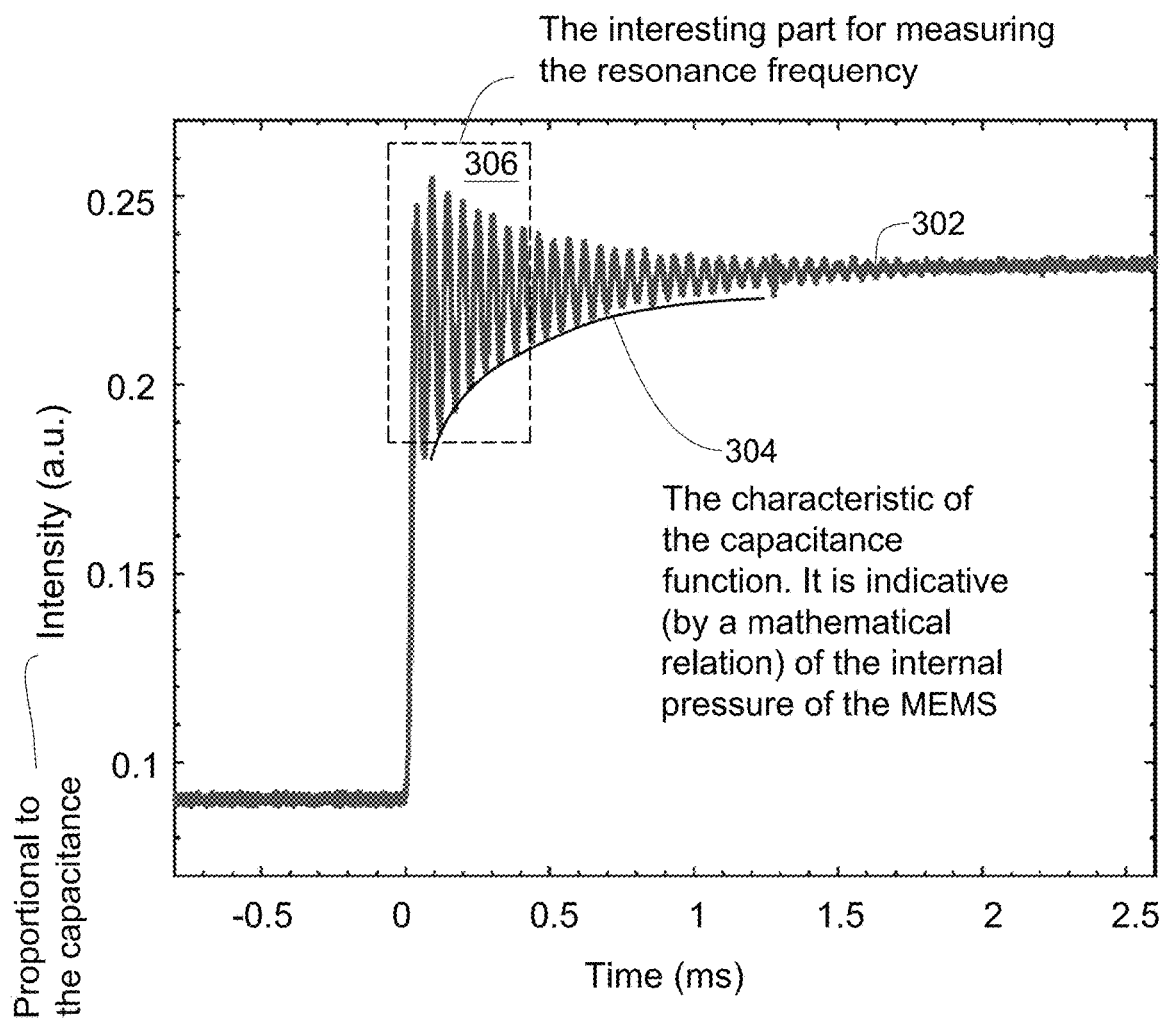
FIG. 14 is an example of an intensity versus time relationship.

One way of determining the internal pressure was by applying an actuation signal and following that, acquiring, at a relatively high sampling rate, images and analyzing at least a portion of the image to identify the resonance frequency of the aperture (the movable member). See box 306 of graph 300 of FIG. 14.

However, it seems to be impractical since it requires a very high sampling rate of an image sensor, which is not available in the market today.

Another alternative for determining the internal pressure of the MEMS based on the movement of the aperture is by measuring a plurality of capacitance measurements (namely the capacitance between electrodes on the aperture and electrodes on a stationary component, e.g. the cap). These kind of measurements can be carried out at a sampling rate that is suitable for identifying the characteristics of the movement of the aperture. See curve 304 of FIG. 14.

Figure 15:
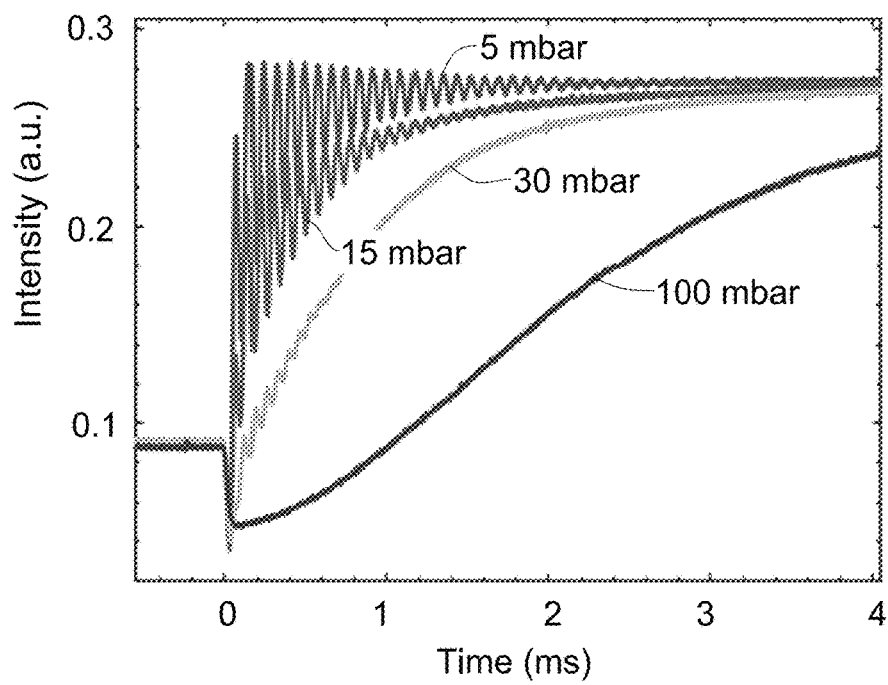
FIG. 15 is an example of an intensity versus time relationship for different internal pressure levels.

FIG. 15 shows the dependency of the characteristics of the capacitance function on the internal pressure of the MEMS.

Figure 16:
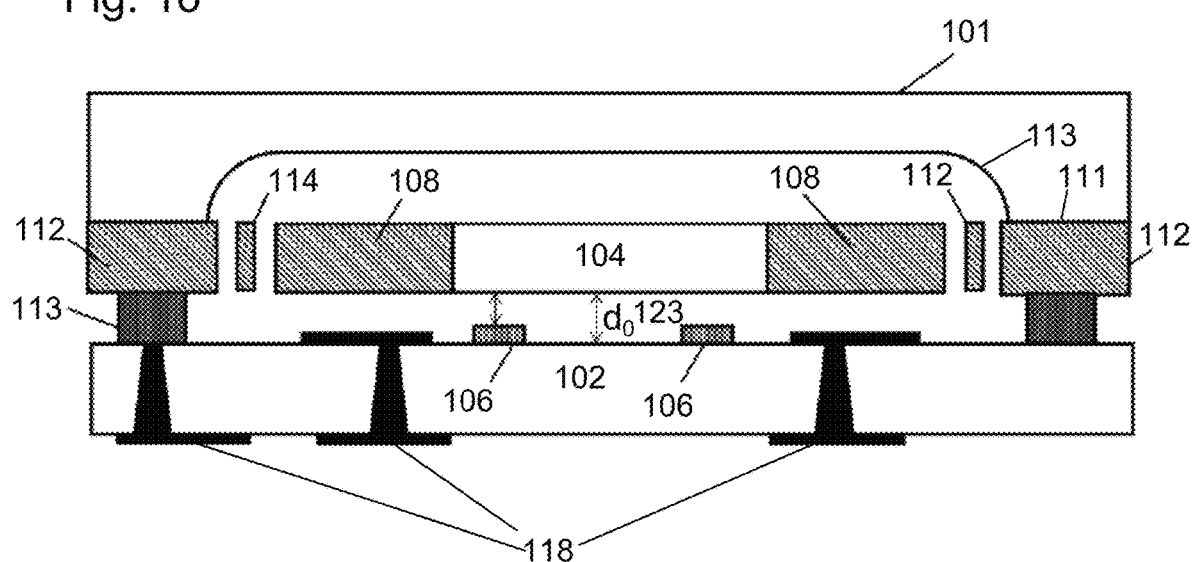
FIG. 16 is an example of a tunable filter.

FIG. 16 illustrates cross sections of a tunable filter 100 that includes:
a. Cap 101. Other housing elements may be provided.
b. Stationary member 102 that may include an optical region that participates in the spectral response of the tunable filter, namely filtration of desired electromagnetic radiation, e.g. filtration of certain wavelengths.
c. Movable member 104 that may be a movable optical element that is at least partially transparent.
d. Stopper elements 106 that guarantees a minimal distance between stationary member 102 and movable member 104.
e. One or more first actuation elements 108.
f. Static frame 112.
g. One or more flexible elements 114 such as a spring that is mechanically coupled to frame 112 and one or more first actuation elements 108. The first actuation elements 108 are connected to the movable member 104. The one or more first actuation elements 108 follow a movement of the movable member. The one or more flexible elements 114 support the movable member 104 regardless of the position of the movable member 104.
h. One or more second actuation elements 118.
i. A bond 113 formed between frame 112 and static element 102.

An optical gap do is formed between stationary member 102 and movable member 104 and may define the spectral response of the tunable filter 100.

Figure 17A:
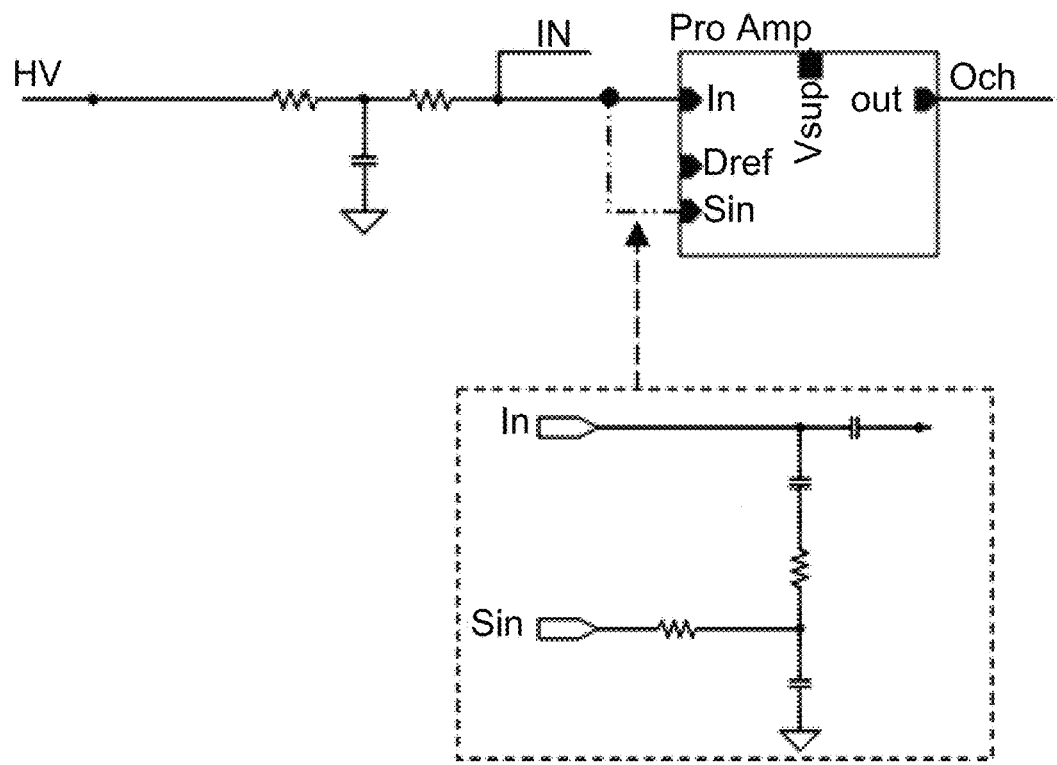
FIGS. 17A and 17B are schematic illustrations of non-limiting examples of implementations of parts of the control system of the present disclosure.
Figure 17B:
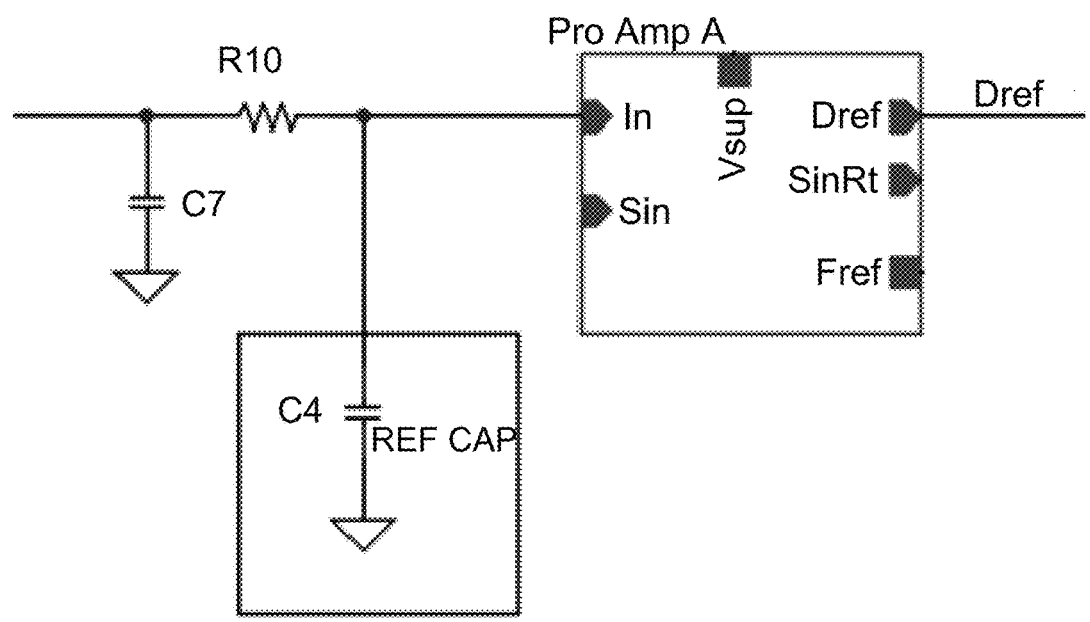

FIGS. 17A and 17B exemplify implementations of providing the first and second components of the voltage signal profile for an actuation region in the MEMS tunable filter and reference capacitor, respectively. FIG. 17A shows a DC voltage source HV that is configured to provide a voltage profile of a first, DC voltage to an actuation region IN, e.g. an electrode of the tunable filter, electrically connected thereto. An AC voltage source Sin is configured to provide the second, AC component to effectively apply on the actuation region IN together with the first component. The dashed rectangle shows an example of the electrical connection implementation of the AC voltage source Sin with the actuation region In. The solid rectangle exemplify the sampling circuit that includes an input of the resultant signal from the actuation region In that is subtracted from the reference signal input Dref. The output signal that is sampled Och is the subtraction of the AC component of the resultant signal In from the AC component of the reference signal Dref. The output signal Och represents the variation of the AC component of the voltage signal profile provided to the actuation region with respect to the reference signal, which is indicative of the capacitance and hence the tunable filter's optical gap between the actuation region IN and its respective actuation region on the other optical member. The voltage source Vsup provides power to different components of the sampling circuit (there may be other components that are not shown in the figure).

FIG. 17B shows the electrical circuit configuration of the reference signal. The configuration is similar to that of FIG. 17A, only the voltage profile, namely the DC and the AC components of the voltage, is provided to a reference capacitor REF CAP. The reference signal is then outputted Dref to be received in the sampling circuit shown in FIG. 17A for further analysis with the resultant signal to determine the state of the tunable filter. Typically, DC component of the reference signal is filtered out and the reference signal Dref includes only the AC component.

The various features and steps discussed above, as well as other known equivalents for each such feature or step, can be mixed and matched by one of ordinary skill in this art to perform methods in accordance with principles described herein.

Although the disclosure has been provided in the context of certain embodiments and examples, it will be understood by those skilled in the art that the disclosure extends beyond the specifically described embodiments to other alternative embodiments and/or uses and obvious modifications and equivalents thereof. Accordingly, the disclosure is not intended to be limited by the specific disclosures of embodiments herein.

Unless otherwise stated, the use of the expression "and/or" between the last two members of a list of options for selection indicates that a selection of one or more of the listed options is appropriate and may be made.

It should be understood that where the claims or specification refer to "a" or "an" element, such reference is not to be construed as there being only one of that element. It is appreciated that certain features of the invention, which are, for clarity, described in the context of separate embodiments or example, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

The terms "including", "comprising", "having", "consisting" and "consisting essentially of" are used in an interchangeable manner. For example—any method may include at least the steps included in the figures and/or in the specification, only the steps included in the figures and/or the specification.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim.

The word 'comprising' does not exclude the presence of other elements or steps then those listed in a claim. Furthermore, the terms "a" or "an," as used herein, are defined as one as or more than one.

Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit that is illustrated in any of the figures and/or specification and/or the claims may be provided.

Any combination of any optical device illustrated in any of the figures and/or specification and/or the claims may be provided.

Any combination of steps, operations and/or methods illustrated in any of the figures and/or specification and/or the claims may be provided.

Any combination of operations illustrated in any of the figures and/or specification and/or the claims may be provided.

Any combination of methods illustrated in any of the figures and/or specification and/or the claims may be provided.

We claim:

1. A system for monitoring a state of a tunable filter that comprises a first and second optical members, at least the first member is movable with respect to the second member upon application of voltage difference between first actuation regions thereon and respective second actuation regions on the second member, the system comprising:
  a processing circuitry configured to (i) operate one or more voltage sources for applying a selected profile of a voltage signal to at least one of said first or second actuation regions, said selected profile comprises at least a first component for resulting a movement of the movable member and a second component configured for being varied in response for a given state of the tunable filter and (ii) to analyze a resultant signal of said voltage signal and determine a variation profile of the resultant signal from the provided voltage signal, said variation profile is being indicative of the state of the tunable filter;

the system further comprising a dissipation element electrically connected to at least one of the first or second actuation regions such that upon oscillation of the first member, energy is dissipated therethrough to obtain a quality factor of the first member lower than 1000.

2. The system of claim 1, wherein said analysis comprises determining the variation profile of the second component being indicative of the state of the tunable filter.

3. The system of claim 1, wherein said voltage signal is a composite signal and the first and the second components are having different frequency characteristics.

4. The system of claim 1, wherein the first component is being a DC component and the second component is being an AC component.

5. The system of claim 4, comprising a reference capacitance for receiving the reference signal, the processing circuitry is configured for retrieving an output product of the combined signal of the reference signal from said reference capacitance and at least the second component of the resultant signal for obtaining the state of the tunable filter.

6. The system of claim 1, wherein the processing circuitry is configured to operate the one or more voltage sources to provide a reference signal identical to said second component of said voltage signal, wherein said analysis comprises determining a relation between a varied second component of the resultant signal with said reference signal and determining the variation profile.

7. The system of claim 1, wherein said analysis comprises determining a variation of the amplitude of the second component.

8. The system of claim 1, wherein the processing circuitry is further configured for controlling said selected profile of the voltage signal in response to the monitored state of the tunable filter.

9. The system of claim 1, wherein the processing circuitry is configured to operate the one or more voltage sources for applying a unique selected profile of a voltage signal to each of the at least one of said first or second actuation regions.

10. A tunable filter, comprising:
a first and second optical members that comprises first and second actuation regions respectively such that at least the first member is movable with respect to the second member upon application of voltage difference between the first actuation regions thereon and the respective second actuation regions on the second member;
a dissipation element electrically connected to at least one of first or second actuation regions such that upon oscillation of the first member, energy is dissipated therethrough to obtain a quality factor of the first member lower than 1000.

11. The tunable filter of claim 10, wherein the dissipation element is a resistor electrically connected in series from one side to at least one first or second actuation regions and from the other side to a voltage source configured to provide said application of voltage difference.

12. The tunable filter of claim 10, wherein the dissipation element is a controllable variable resistor configured to controllably change its resistance based on values of at least one characteristic parameter of the tunable filter.

13. The tunable filter of claim 12, wherein said at least on characteristic parameter is internal pressure within an enclosure enclosing the first movable member.

14. The tunable filter of claim 13, wherein the resistance of the variable resistor is configured to be reduced in response to an increase of the internal pressure.

15. A method for operating a device that comprises a microelectromechanical (MEMS) tunable filter and an image sensor, the method comprises:
supplying hybrid signals, during an evaluation period, to multiple electrodes that are coupled to multiple optical elements of the MEMS tunable filter that are spaced apart from each other by one or more gaps; wherein the one or more gaps determine a spectral response of the MEMS tunable filter; wherein each hybrid signal includes a direct current (DC) component and an alternate current (AC) component; and
performing, during different points in time of the evaluation period, different measurements of signals received, responsive to the supplying of the hybrid signals, from the multiple electrodes; and
evaluating one or more dimensional parameters of the one or more gaps based on the different measurements of the signals received from the multiple electrodes.

16. The method according to claim 15 comprising individually supplying the hybrid signals to each one of the multiple electrodes.

17. The method according to claim 15 wherein the DC component exceeds the AC component.

18. The method according to claim 15 wherein each electrode receives concurrently the DC component and the AC component.

19. The method according to claim 15 wherein at least two hybrid signals supplied to at least two electrodes have a same AC component but have different DC components.

20. The method according to claim 15 comprising generating a reference signal that has an AC component and no DC component, wherein a relationship between the reference signal and the measured response of the capacitance in each electrode is indicative of the dimensional parameters.

21. A device comprising: a microelectromechanical (MEMS) tunable filter, and a processing circuitry configured to:
control supplying hybrid signals, during an evaluation period, to multiple electrodes that are coupled to multiple optical elements of the MEMS tunable filter that are spaced apart from each other by one or more gaps; wherein each gap defines a respective spectral response of the MEMS tunable filter; wherein each hybrid signal includes a direct current (DC) component and an alternate current (AC) component;
perform, during different points in time of the evaluation period, different measurements of signals received, responsive to the supplying of the hybrid signals, from the multiple electrodes; and
evaluate one or more dimensional parameters of the one or more gaps based on the different measurements of the signals received from the multiple electrodes.

22. The device according to claim 21, wherein the hybrid signals are individually supplied to each one of the multiple electrodes.

23. The device according to claim 21 wherein the DC component exceeds the AC component.

24. The device according to claim 21 wherein at least two hybrid signals are supplied to at least two electrodes, the at least two hybrid signals are characterized by a same AC component and different DC component.

25. The device according to claim 21, wherein the processing circuitry is configured to generate a reference signal that has an AC component and no DC component, wherein a relationship between the reference signal and the measured response of the capacitance in each electrode is indicative of the dimensional parameters.

* * * * *